US010832786B2

(12) United States Patent
Maejima

(10) Patent No.: US 10,832,786 B2
(45) Date of Patent: Nov. 10, 2020

(54) SEMICONDUCTOR STORAGE DEVICE

(71) Applicant: Toshiba Memory Corporation, Tokyo (JP)

(72) Inventor: Hiroshi Maejima, Setagaya Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/551,479

(22) Filed: Aug. 26, 2019

(65) Prior Publication Data
US 2020/0126628 A1 Apr. 23, 2020

(30) Foreign Application Priority Data

Oct. 22, 2018 (JP) .................. 2018-198575

(51) Int. Cl.
G11C 16/34 (2006.01)
H01L 27/11556 (2017.01)
H01L 27/11582 (2017.01)
G11C 16/10 (2006.01)

(52) U.S. Cl.
CPC ........ G11C 16/3454 (2013.01); G11C 16/107 (2013.01); H01L 27/11556 (2013.01); H01L 27/11582 (2013.01)

(58) Field of Classification Search
CPC .............. G11C 16/3454; G11C 16/107; G11C 11/5642; G11C 2211/5621; G11C 11/5628; G11C 16/0483; G11C 16/10; G11C 16/30; G11C 16/08; H01L 27/11556; H01L 27/11582
See application file for complete search history.

(56) References Cited

U.S. PATENT DOCUMENTS 9,331,091 B1 * 5/2016 Cernea .............. H01L 21/76802
2012/0287710 A1 11/2012 Shirakawa
2016/0260732 A1 * 9/2016 Lue .................. H01L 27/11565

FOREIGN PATENT DOCUMENTS

JP 2012-238363 A 12/2012

* cited by examiner

Primary Examiner — Ajay Ojha
(74) Attorney, Agent, or Firm — Kim & Stewart LLP

(57) ABSTRACT

A semiconductor storage device includes first and second memory cell transistors at opposite sides of a first semiconductor body, third and fourth memory cell transistors at opposite sides of a second semiconductor body, a first word line connected to gates of the first and third memory cell transistors, a second word line connected to gates of the second and fourth memory cell transistors, and a controller. During a program operation on the third memory cell transistor, the controller determines a program voltage on the basis of a first number of loops determined during the write operation performed on the first memory cell transistor, and during a program operation on the fourth memory cell transistor, the controller determines a program voltage on the basis of a second number of loops determined during the write operation performed on the second memory cell transistor.

20 Claims, 31 Drawing Sheets

|  | MG0 | MG1 | MG2 | MG3 | MG4 | MG5 | MG6 | MG7 |
|---|---|---|---|---|---|---|---|---|
| WL7 | 56 | 60 | 57 | 61 | 58 | 62 | 59 | 63 |
| WL6 | 48 | 52 | 49 | 53 | 50 | 54 | 51 | 55 |
| ⋮ | ⋮ | ⋮ | ⋮ | ⋮ | ⋮ | ⋮ | ⋮ | ⋮ |
| WL1 | 8 | 12 | 9 | 13 | 10 | 14 | 11 | 15 |
| WL0 | 0 | 4 | 1 | 5 | 2 | 6 | 3 | 7 |

|  | MG0 | MG1 | MG2 | MG3 | MG4 | MG5 | MG6 | MG7 |
|---|---|---|---|---|---|---|---|---|
| WL7 | 28 | 60 | 29 | 61 | 30 | 62 | 31 | 63 |
| WL6 | 24 | 56 | 25 | 57 | 26 | 58 | 27 | 59 |
| ⋮ | ⋮ | ⋮ | ⋮ | ⋮ | ⋮ | ⋮ | ⋮ | ⋮ |
| WL1 | 4 | 36 | 5 | 37 | 6 | 38 | 7 | 39 |
| WL0 | 0 | 32 | 1 | 33 | 2 | 34 | 3 | 35 |

|     | MG0 | MG1 | MG2 | MG3 | MG4 | MG5 | MG6 | MG7 |
|-----|-----|-----|-----|-----|-----|-----|-----|-----|
| WL7 | 56  | 57  | 58  | 59  | 60  | 61  | 62  | 63  |
| WL6 | 48  | 49  | 50  | 51  | 52  | 53  | 54  | 55  |
| ⋮   | ⋮   | ⋮   | ⋮   | ⋮   | ⋮   | ⋮   | ⋮   | ⋮   |
| WL1 | 8   | 9   | 10  | 11  | 12  | 13  | 14  | 15  |
| WL0 | 0   | 1   | 2   | 3   | 4   | 5   | 6   | 7   |

FIG. 20

| ELEMENT | COUNT |
|---|---|
| WLe0 | 3 |
| WLo0 | 5 |
| WLe1 | 4 |
| WLo1 | 6 |
| WLe2 | 5 |
| WLo2 | 7 |
| WLe3 | 6 |
| WLo3 | 8 |
| WLe4 | 7 |
| WLo4 | 9 |
| WLe5 | 8 |
| WLo5 | 10 |
| WLe6 | 9 |
| WLo6 | 11 |
| WLe7 | 10 |
| WLo7 | 12 |

| ELEMENT | COUNT |
|---|---|
| WLe0 | 3 |
| WLo0 | 5 |
| WLe1 | 4 |
| WLe2 | 5 |
| WLe3 | 6 |
| WLe4 | 7 |
| WLe5 | 8 |
| WLe6 | 9 |
| WLe7 | 10 |
| DIFFERENCE | +2 |

SEMICONDUCTOR STORAGE DEVICE

CROSS-REFERENCE TO RELATED APPLICATION

This application is based upon and claims the benefit of priority from Japanese Patent Application No. 2018-198575, filed Oct. 22, 2018, the entire contents of which are incorporated herein by reference.

FIELD

Embodiments described herein relate generally to a semiconductor storage device.

BACKGROUND

There is a semiconductor storage device in which memory cells are arranged in a three-dimensional manner.

DESCRIPTION OF THE DRAWINGS

FIG. 20 is a conceptual diagram illustrating information stored in a writing information register of the first embodiment.

DETAILED DESCRIPTION

Figure 1:
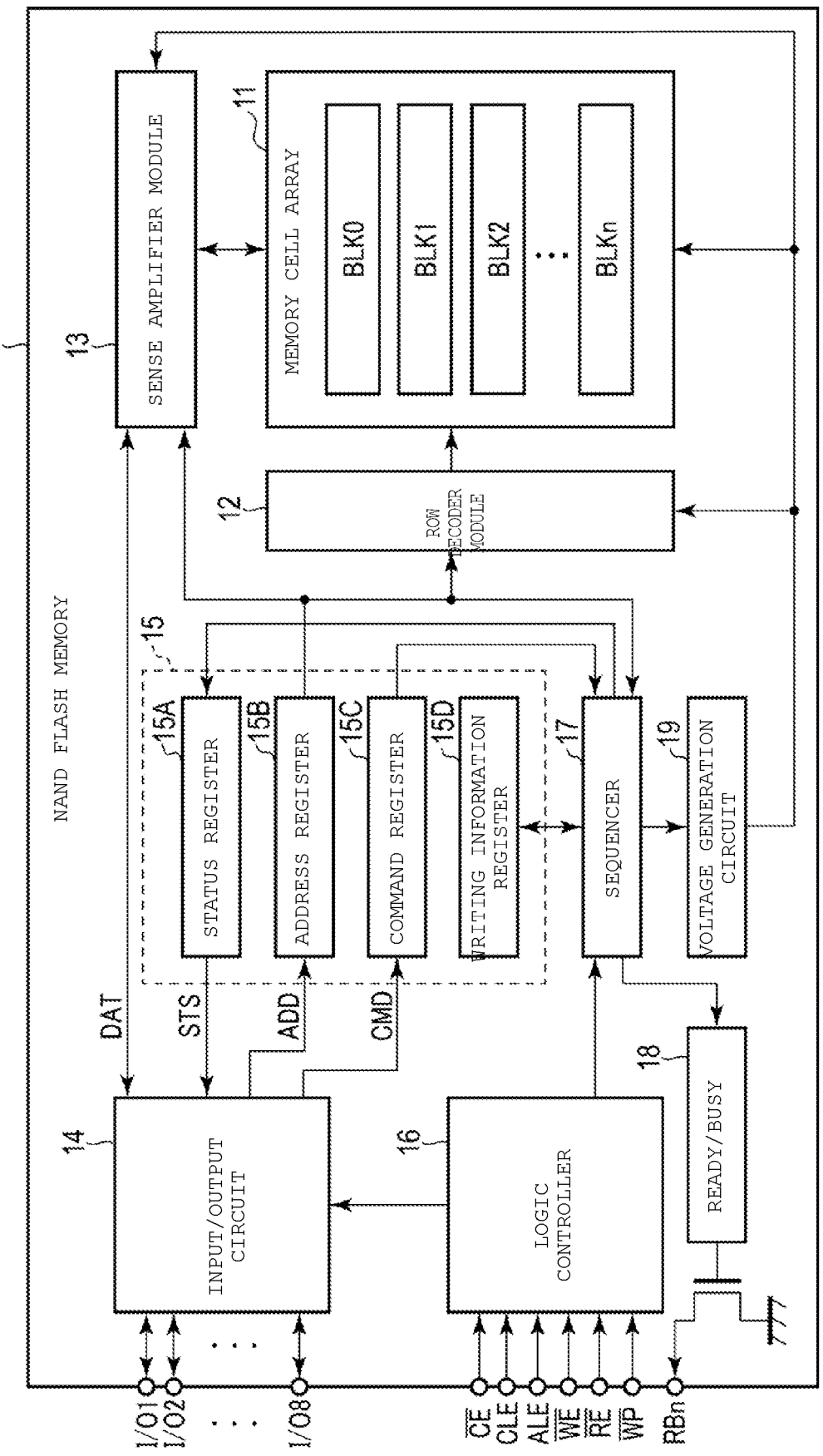
FIG. 1 is a block diagram illustrating a semiconductor storage device according to a first embodiment.

Embodiments provide a semiconductor storage device which can operate at a high speed.

In general, according to one embodiment, a semiconductor storage device includes a plurality of memory cell transistors above a semiconductor substrate, including first, second, third, and fourth memory cell transistors, wherein the first and second memory cell transistors are at opposite sides of a first semiconductor body in which channel regions of the first and second memory cell transistors are located, and third and fourth memory cell transistors are at opposite sides of a second semiconductor body in which channel regions of the third and fourth memory cell transistors are located, first, second, third, and fourth select transistors connected to the first, second, third, and fourth memory cell transistors, respectively, a plurality of word lines including a first word line connected to gates of the first and third memory cell transistors, and a second word line connected to gates of the second and fourth memory cell transistors, a first bit line connected to the first and second select transistors, a second bit line connected to the third and fourth select transistors, and a controller configured to perform a write operation on the first to fourth memory cell transistors in a plurality of loops, each loop including a program operation and a verify operation. During a program operation on the third memory cell transistor, the controller determines a program voltage to be applied to the first word line on the basis of a first number of loops, which is determined during the write operation performed on the first memory cell transistor, and during a program operation on the fourth memory cell transistor, the controller determines a program voltage to be applied to the second word line on the basis of a second number of loops, which is determined during the write operation performed on the second memory cell transistor.

Hereinafter, embodiments will be described with reference to the drawings. In the following description, a elements having substantially the same function and configuration will be given the same reference numeral or symbol, and the description thereof will not be repeated. All descriptions of a certain embodiment are applicable to other embodiments unless expressly excluded or their exclusion is obvious from context.

It is not essential that functional blocks described below are depicted as in the following examples. For example, some functions may be executed by a functional block which is different from the functional block depicted herein. The functional block depicted herein may be divided into sub-functional blocks. An embodiment is not limited to the functional blocks depicted herein.

In the present specification and the claims, a first element "being connected to" a second element means that the first element is directly connected to the second element, or the first element and the second element are connected to each other via an element which is conductive at all times or selectively conductive.

1. First Embodiment

A semiconductor storage device according to the present embodiment will be described. The semiconductor storage device is a NAND flash memory.

1.1 Configuration

1.1.1 Overall Configuration

FIG. 1 is a block diagram illustrating an example of the overall configuration of a semiconductor storage device 10 according to a first embodiment. As illustrated in FIG. 1, the semiconductor storage device 10 includes a memory cell array 11, a row decoder module 12, a sense amplifier module 13, an input/output circuit 14, a register unit 15, a logic controller 16, a sequencer 17, a ready/busy control circuit 18, and a voltage generation circuit 19.

The memory cell array 11 includes blocks BLK0 to BLKn (where n is a natural number 1 or greater). The block BLK is a set of a plurality of nonvolatile memory cells associated with bit lines and word lines, and is, for example, a unit of data erasing. The block BLK includes a plurality of memory cells which are associated with rows and columns and are stacked in a three-dimensional manner. The semiconductor storage device 10 employs, for example, a multi-level cell (MLC) method for programming, by which two or more bits can be stored in each memory cell.

The row decoder module 12 selects a target block BLK on which various operations are performed on the basis of a block address stored in an address register 15B. The row decoder module 12 transmits a voltage supplied from the voltage generation circuit 19 to the selected block BLK.

The sense amplifier module 13 outputs data DAT read from the memory cell array 11, to an external controller via the input/output circuit 14. The sense amplifier module 13 also transmits write data DAT which is received from the external controller via the input/output circuit 14, to the memory cell array 11.

The input/output circuit 14 transmits and receives, for example, input/output signal I/O (collectively representing I/O1 to I/O8) of 8-bit width to and from the external controller. For example, the input/output circuit 14 transmits write data DAT included in the input/output signal I/O received from the external controller, to the sense amplifier module 13, and transmits read data DAT transmitted from the sense amplifier module 13, to the external controller as the input/output signal I/O.

The register unit 15 includes a status register 15A, an address register 15B, a command register 15C, and a writing information register 15D. The status register 15A stores, for example, status information STS of the sequencer 17, and transmits the status information STS to the input/output circuit 14 on the basis of an instruction from the sequencer 17. The address register 15B stores address information ADD transmitted from the input/output circuit 14. A block address, a column address, and a page address included in the address information ADD are respectively used in the row decoder module 12, the sense amplifier module 13, and the voltage generation circuit 19. The command register 15C stores a command CMD transmitted from the input/output circuit 14. The writing information register 15D stores, for example, the number of times required for writing.

The logic controller 16 may control the input/output circuit 14 and the sequencer 17 on the basis of various control signals received from the external controller. The various control signals may include, for example, a chip enable signal/CE, a command latch enable signal CLE, an address latch enable signal ALE, a write enable signal/WE, a read enable signal/RE, and a write protect signal/WP. The signal/CE is a signal for enabling the semiconductor storage device 10. The signal CLE is a signal for notifying the input/output circuit 14 that a signal input to the semiconductor storage device 10 along with the asserted signal CLE indicates the command CMD. The signal ALE is a signal for notifying the input/output circuit 14 that a signal input to the semiconductor storage device 10 along with the asserted signal ALE indicates the address information ADD. The signals/WE and/RE are respectively signals for instructing the input/output circuit 14 to receive and output the input/output signals I/O. The signal/WP is, for example, a signal for bringing the semiconductor storage device 10 into a protection state during ON and OFF of a power source.

The sequencer 17 controls the overall operation of the semiconductor storage device 10 on the basis of the command CMD stored in the command register 15C. For example, the sequencer 17 controls the row decoder module 12, the sense amplifier module 13, and the voltage generation circuit 19 to perform various operations such as a write operation or a read operation.

The ready/busy control circuit 18 generates a ready/busy signal RBn on the basis of an operation state of the sequencer 17. The signal RBn is a signal for notifying the external controller whether the semiconductor storage device 10 is in a ready state in which state it is capable of receiving a command from the external controller or in a busy state in which state it is not capable of receiving a command.

The voltage generation circuit 19 generates desired voltages under the control of the sequencer 17, and supplies the generated voltages to the memory cell array 11, the row decoder module 12, and the sense amplifier module 13. For example, the voltage generation circuit 19 applies desired voltages to a signal line corresponding to a selected word line and a signal line corresponding to a non-selected word line on the basis of page addresses stored in the address register 15B.

1.1.2 Configuration of Memory Cell Array 11

Next, a description will be made of a configuration of the memory cell array 11 according to the present embodiment.

Circuit Configuration of Memory Cell Array

Figure 2:
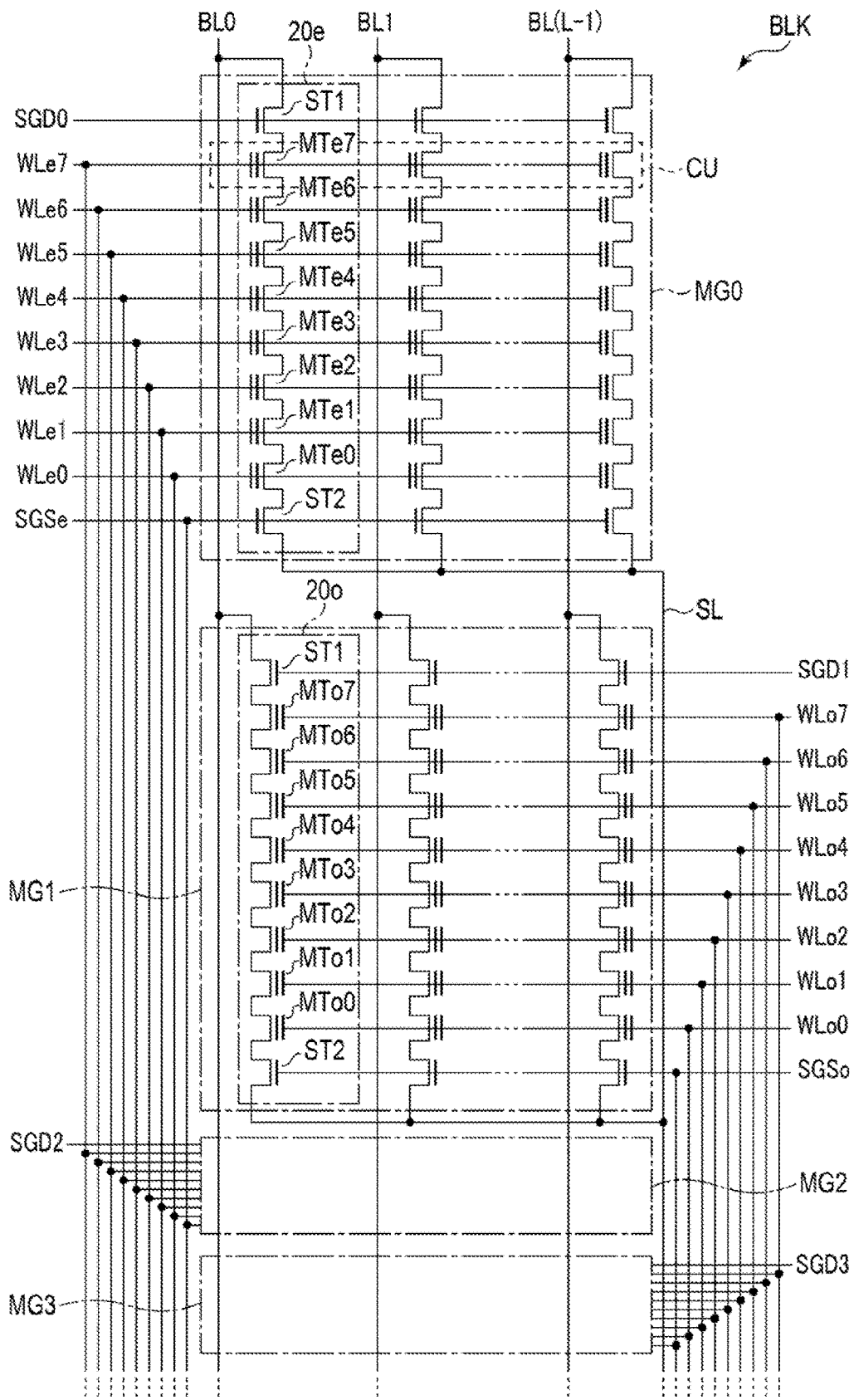
FIG. 2 is a circuit diagram illustrating a memory cell array of the first embodiment.

First, with reference to FIG. 2, a description will be made of an example of a circuit configuration of the memory cell array 11. FIG. 2 is an equivalent circuit diagram of the block BLK. As illustrated in FIG. 2, the block BLK includes a plurality of memory groups MG (MG0, MG1, MG2, Each of the memory groups MG includes a plurality of NAND strings 20. Hereinafter, NAND strings of even memory groups MGe (MG0, MG2, MG4, will be referred to as NAND strings 20e, and NAND strings of odd memory groups MGo (MG1, MG3, MG5, will be referred to as NAND strings 20o.

Each of the NAND strings 20 includes, for example, eight memory cell transistors MT (MT0 to MT7) and select transistors ST1 and ST2. Each of the memory cell transistors MT includes a control gate and a charge storage layer, and stores data in a nonvolatile manner. The memory cell transistors MT are connected in series to each other between a source of the select transistor ST1 and a drain of the select transistor ST2. Hereinafter, the memory cell transistors MT in the NAND string 20e will be referred to as memory cell transistors MTe, and the memory cell transistors MT in the NAND string 20o will be referred to as memory cell transistors MTo.

Gates of the select transistors ST1 in the memory groups MG0 to MG7 are respectively connected in common to select gate lines SGD0 to SGD7. A voltage is independently applied to each select gate line SGD via the row decoder module 12. Gates of the select transistors ST2 in the even memory groups MGe are connected in common to, for example, a select gate line SGSe, and gates of the select transistors ST2 in the odd memory groups MGo are connected in common to, for example, a select gate line SGSo. For example, voltages are independently applied to the select gate lines SGSe and SGSo. The select gate lines SGSe and SGSo may be connected in common to each other, and, when they are, the same voltage is applied to the select gate lines SGSe and SGSo.

In the block BLK, control gates of the memory cell transistors MTe0 to MTe7 in the memory groups MGe are respectively connected in common to word lines WLe0 to WLe7. On the other hand, control gates of the memory cell transistors MTo0 to MTo7 in the memory groups MGo are respectively connected in common to word lines WLo0 to WLo7. Voltages are independently applied to the word lines WLe and WLo via the row decoder module 12.

Drains of the select transistors ST1 of the NAND strings 20 in the same column of the memory cell array 11 are connected to a common bit line BL. In other words, the bit line BL connects the NAND strings 20 to each other across the plurality of memory groups MG. Sources of the plurality of select transistors ST2 are connected in common to a source line SL.

A set of a plurality of memory cell transistors MT connected to a common word line WL in a single memory group MG will be referred to as, for example, a cell unit CU. For example, a storage capacity of the cell unit CU including the memory cell transistors MT each storing 1-bit data is 1 page. The cell unit CU may have a storage capacity of 2 pages or more according to the number of bits of data stored per the memory cell transistor MT.

As mentioned above, the memory group MG includes a plurality of NAND strings 20 which are connected to different bit lines BL and are connected to the same select gate line SGD. The block BLK includes a plurality of memory groups MG sharing the same word lines WL. The memory cell array 11 includes a plurality of blocks BLK sharing the bit lines BL.

Planar Layout of Memory Cell Array

Figure 3:
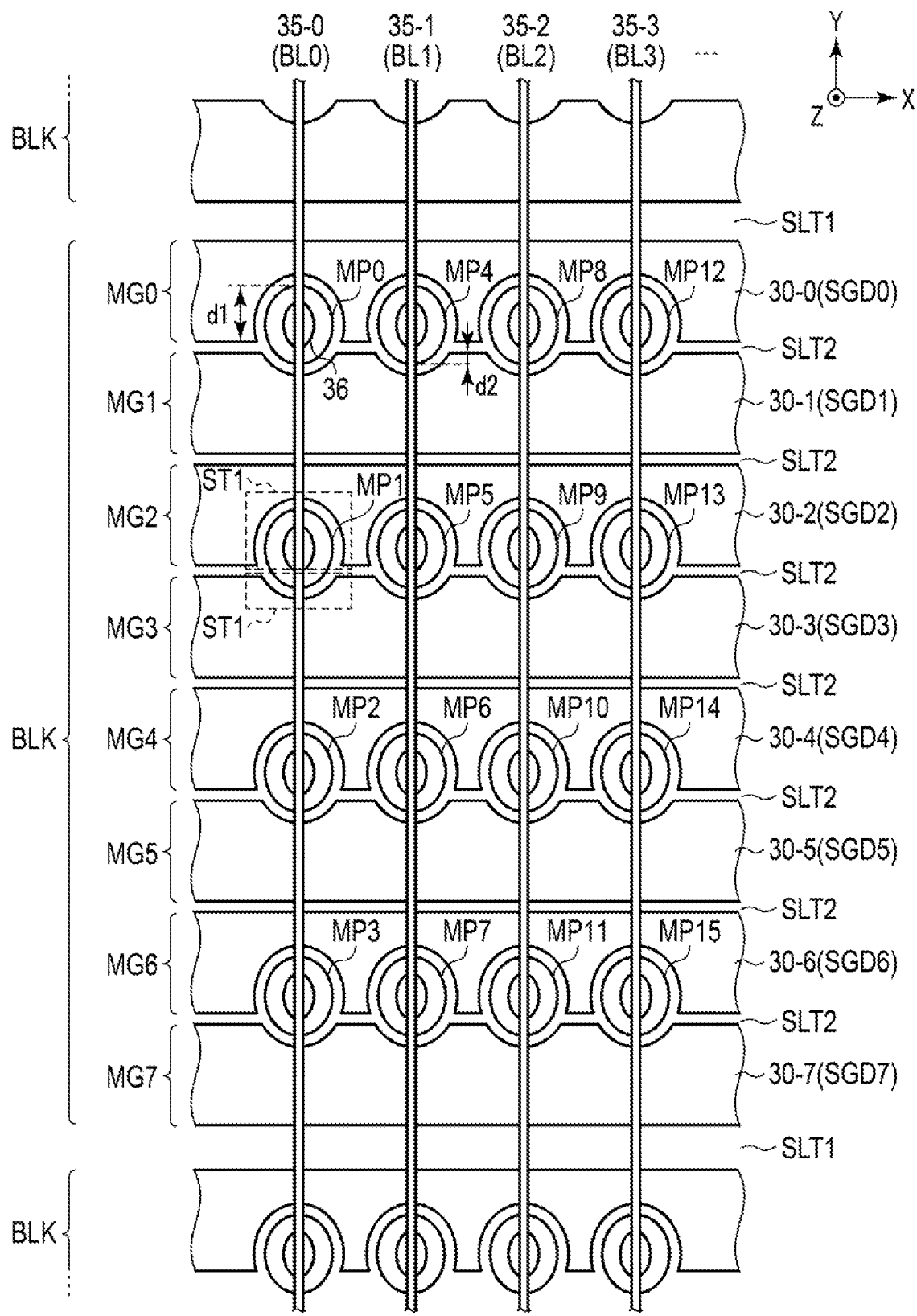
FIG. 3 is a planar layout illustrating a select gate line of the first embodiment.

Next, a description will be made of an example of a planar layout of the memory cell array 11. FIG. 3 illustrates an example of a planar layout of the select gate line SGD of a certain block BLK in an XY plane. In the following description, the XY plane corresponds to a plane parallel to an upper surface of a semiconductor substrate, and an X direction is orthogonal to a Y direction. A Z direction is a direction orthogonal to the X direction and the Y direction, that is, a direction perpendicular to the semiconductor substrate surface.

In this example, eight select gate lines SGD are provided in a single block BLK, and description will focus on a region including four bit lines BL (BL0 to BL3).

As illustrated in FIG. 3, eight wiring layers 30 (30-0 to 30-7) extending in the X direction are arranged in the Y direction. Each of the wiring layers 30 functions as the select gate line SGD. Specifically, the wiring layers 30-0 to 30-7 respectively function as the select gate lines SGD0 to SGD7. Therefore, the memory groups MG0 to MG7 in the same block BLK are arranged in the Y direction in the XY plane view.

The wiring layers 30 adjacent to each other in the Y direction in the block BLK are separated from each other via an insulating film (not illustrated). A region in which the insulating film is provided will be referred to as a slit SLT2. In the slit SLT2, the insulating film is disposed in, for example, a region from the upper surface of the semiconductor substrate to at least a layer in which the wiring layer 30 is provided. A plurality of blocks BLK illustrated in FIG. 3 are arranged, for example, in the Y direction in the memory cell array 11. The blocks BLK adjacent to each other in the Y direction are also separated from each other via an insulating film (not illustrated). A region in which the insulating film is provided will be referred to as a slit SLT1. A structure of the slit SLT1 is the same as a structure of the slit SLT2.

A plurality of memory pillars MP (MP0 to MP15) each along the Z direction are provided between the wiring layers 30 adjacent to each other in the Y direction such that the slit SLT2 has regions penetrated by the pillars that are alternately arranged with regions not penetrated by the pillars.

Specifically, the memory pillars MP0, MP4, MP8, and MP12 are provided between the wiring layers 30-0 and 30-1, the memory pillars MP1, MP5, MP9, and MP13 are provided between the wiring layers 30-2 and 30-3, the memory pillars MP2, MP6, MP10, and MP14 are provided between the wiring layers 30-4 and 30-5, and the memory pillars MP3, MP7, MP11, and MP15 are provided between the wiring layers 30-6 and 30-7. The memory pillar MP is a structural body corresponding to a set of the NAND strings 20e and 20o, and details thereof will be described later.

The memory pillars MP0 to MP3 are arranged in the Y direction. Similarly, the memory pillars MP4 to MP7, the memory pillars MP8 to MP11, and the memory pillars MP12 to MP15 are respectively arranged in the Y direction.

The memory pillars MP0, MP4, MP8, and MP12 are arranged in the X direction. Similarly, the memory pillars MP1, MP5, MP9, and MP13, the memory pillars MP2, MP6, MP10, and MP14, and the memory pillars MP3, MP7, MP11, and MP15 are respectively arranged in the X direction.

A wiring layer 35-0 (bit line BL0) overlaps (in the Z direction) the memory pillars MP0 to MP3, and is connected in common to the memory pillars MP0 to MP3. A wiring layer 35-1 (bit line BL1) overlaps (in the Z direction) the memory pillars MP4 to MP7, and is connected in common to the memory pillars MP4 to MP7. A wiring layer 35-2 (bit line BL2) overlaps (in the Z direction) the memory pillars MP8 to MP11, and is connected in common to the memory pillars MP8 to MP11. A wiring layer 35-3 (bit line BL3) overlaps (in the Z direction) the memory pillars MP12 to MP15, and is connected in common to the memory pillars MP12 to MP15.

Figure 4:
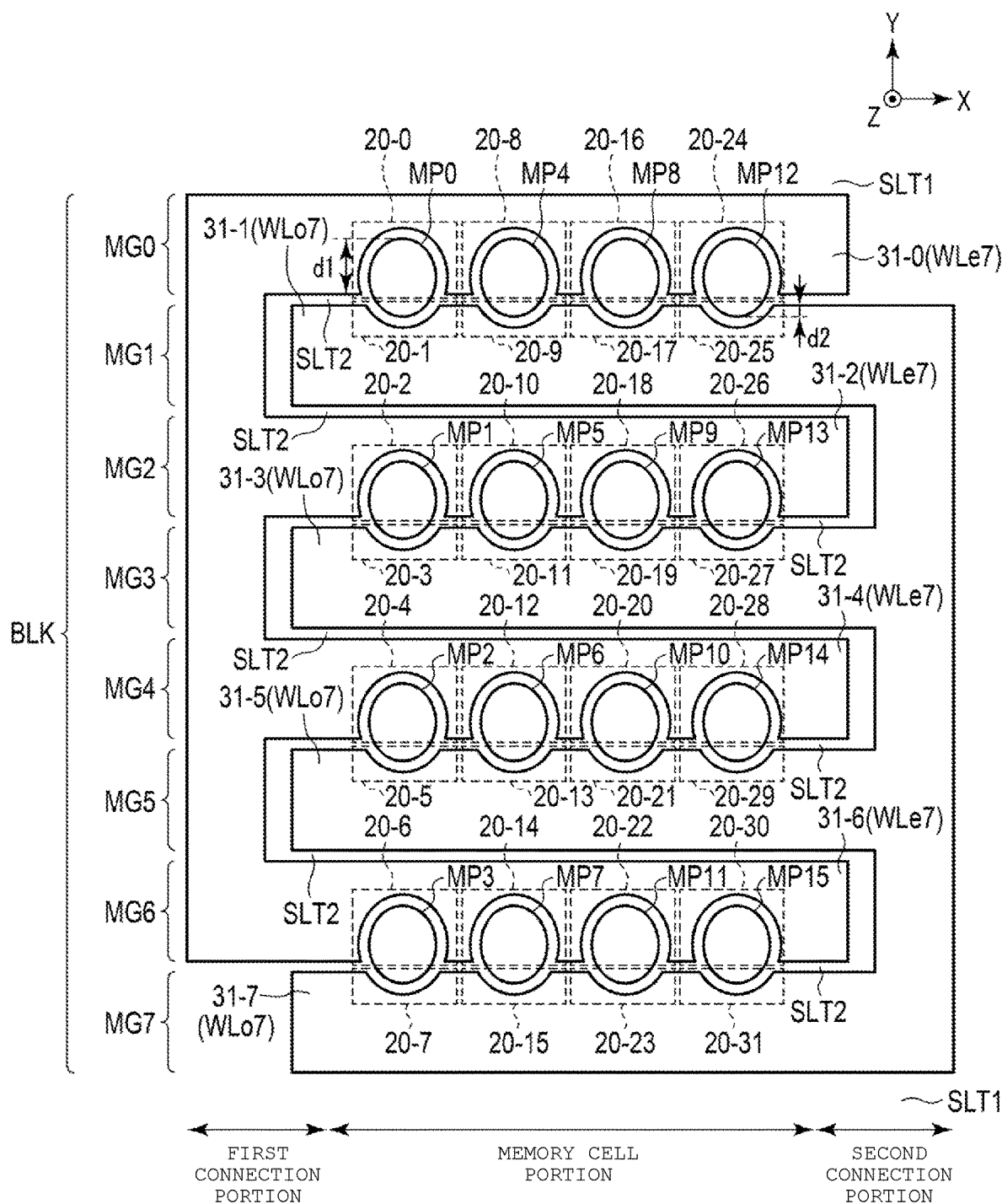
FIG. 4 is a planar layout illustrating a word line of the first embodiment.

FIG. 4 illustrates an example of a planar layout of the word line WL in the XY plane. FIG. 4 illustrates a layout of a wiring layer 31 which corresponds to a region of a single block in FIG. 3 and is provided under the wiring layer 30 described in FIG. 3.

As illustrated in FIG. 4, eight wiring layers 31 (31-0 to 31-7) extending in the X direction are arranged in the Y direction. The wiring layers 31-0 to 31-7 are respectively provided directly under the wiring layers 30-0 to 30-7 via insulating films.

Each wiring layer 31 functions as the word line WL7. The other word lines WL0 to WL6 are similarly provided under the word line WL7. In the example illustrated in FIG. 4, the wiring layers 31-0, 31-2, 31-4, and 31-6 function as the word line WLe7. The wiring layers 31-0, 31-2, 31-4, and 31-6 are extracted from one side in the X direction, and the extracted portions are connected to each other. Hereinafter, a region including the portions of the wiring layers 31-0, 31-2, 31-4, and 31-6 connected to each other will be referred to as a first connection portion. The wiring layers 31-0, 31-2, 31-4, and 31-6 are connected to the row decoder module 12 via the first connection portion.

The wiring layers 31-1, 31-3, 31-5, and 31-7 function as the word line WLo7. The wiring layers 31-1, 31-3, 31-5, and 31-7 are extracted from the other side in the X direction, and the extracted portions are connected to each other. Hereinafter, a region including the portions of the wiring layers 31-1, 31-3, 31-5, and 31-7 connected to each other will be referred to as a second connection portion. The wiring layers 31-1, 31-3, 31-5, and 31-7 are connected to the row decoder module 12 via the second connection portion.

A memory cell portion is provided between the first connection portion and the second connection portion. In the memory cell portion, the wiring layers 31 adjacent to each other in the Y direction are separated from each other via the slit SLT2 described in conjunction with FIG. 3. The wiring layers 31 between the blocks BLK adjacent to each other in the Y direction are also separated from each other via the slit SLT1. The memory pillars MP0 to MP15 are provided in the memory cell portion in the same manner as in FIG. 3.

The configuration is also the same for layers in which other word lines WL and select gate lines SGS are formed. In other words, the NAND string 20-0 is formed on the side on which the memory pillar MP0 faces the word line WLe, and the NAND string 20-1 is formed on the side on which the memory pillar MP0 faces the word line WLo. The NAND string 20-2 is formed on the side on which the memory pillar MP1 faces the word line WLe, and the NAND string 20-3 is formed on the side on which the memory pillar MP1 faces the word line WLo. This is also the same for the memory pillars MP2 to MP15, the even NAND string 20e is formed on the side on which the memory pillar MP faces the word line WLe, and the odd NAND string 20o is formed on the side on which the memory pillar MP faces the word line WLo.

Sectional Structure of Memory Cell Array

Figure 5:
FIGS. 5-6 are each a sectional view illustrating a block of the first embodiment.

Next, a description will be made of an example of a sectional structure of the memory cell array 11. FIG. 5 is a sectional view of the block BLK along the Y direction, and illustrates a sectional structure of a region along the wiring layer 35 (in particular, bit line BL0) in FIG. 3.

As illustrated in FIG. 5, a wiring layer 32 which functions as the select gate line SGS is provided over a semiconductor substrate (for example, a p-type well region) 33. Eight wiring layers 31 which respectively function as the word lines WL0 to WL7 are stacked over the wiring layer 32 in the Z direction. Planar layouts of the wiring layers 31 and 32 are the same as those described in FIG. 4. The wiring layer 30 which functions as the select gate lines SGD is provided over the wiring layers 31. A planar layout of the wiring layer 30 is the same as that described in FIG. 3. As mentioned above, in the memory cell array 11, the select gate line SGS, the word lines WL, and the select gate line SGD are stacked over the semiconductor substrate, and thus the memory cell transistors MT are stacked in a three-dimensional manner.

The slit SLT2 and the memory pillar MP are alternately provided in the Y direction. A diameter of the memory pillar MP is gradually reduced from the upper layer side toward the lower layer side. As described above, the slit SLT2 is formed of an insulating film. However, a contact plug or the like for applying a voltage to a region provided in the semiconductor substrate 33 may be provided in the slit SLT2, and a contact plug for connecting the source of the select transistor ST2 to the source line may be provided therein.

One of the portions of the wiring layer 32 adjacent to each other via the memory pillar MP functions as the select gate line SGSo, and the other portion thereof functions as the select gate line SGSe. Similarly, one of portions of the wiring layer 31 adjacent to each other via the memory pillar MP functions as the word line WLe, and one of portions of the wiring layer 31 adjacent to each other via another memory pillar MP functions as the word line WLo.

The slit SLT1 is provided between the blocks BLK adjacent to each other in the Y direction. The slit SLT1 is also formed of an insulating film. A contact plug or the like for applying a voltage to a region provided in the semiconductor substrate 33 may be provided in the slit SLT1. For example, a contact plug or a groove-shaped conductor for connecting the source of the select transistor ST2 to the source line may be provided. A width of the slit SLT1 in the Y direction is larger than a width of the slit SLT2 in the Y direction.

Contact plugs 36 are provided on the memory pillars MP, and the wiring layer 35 functioning as the bit line BL extends in the Y direction to be connected in common to the contact plugs 36.

Figure 6:
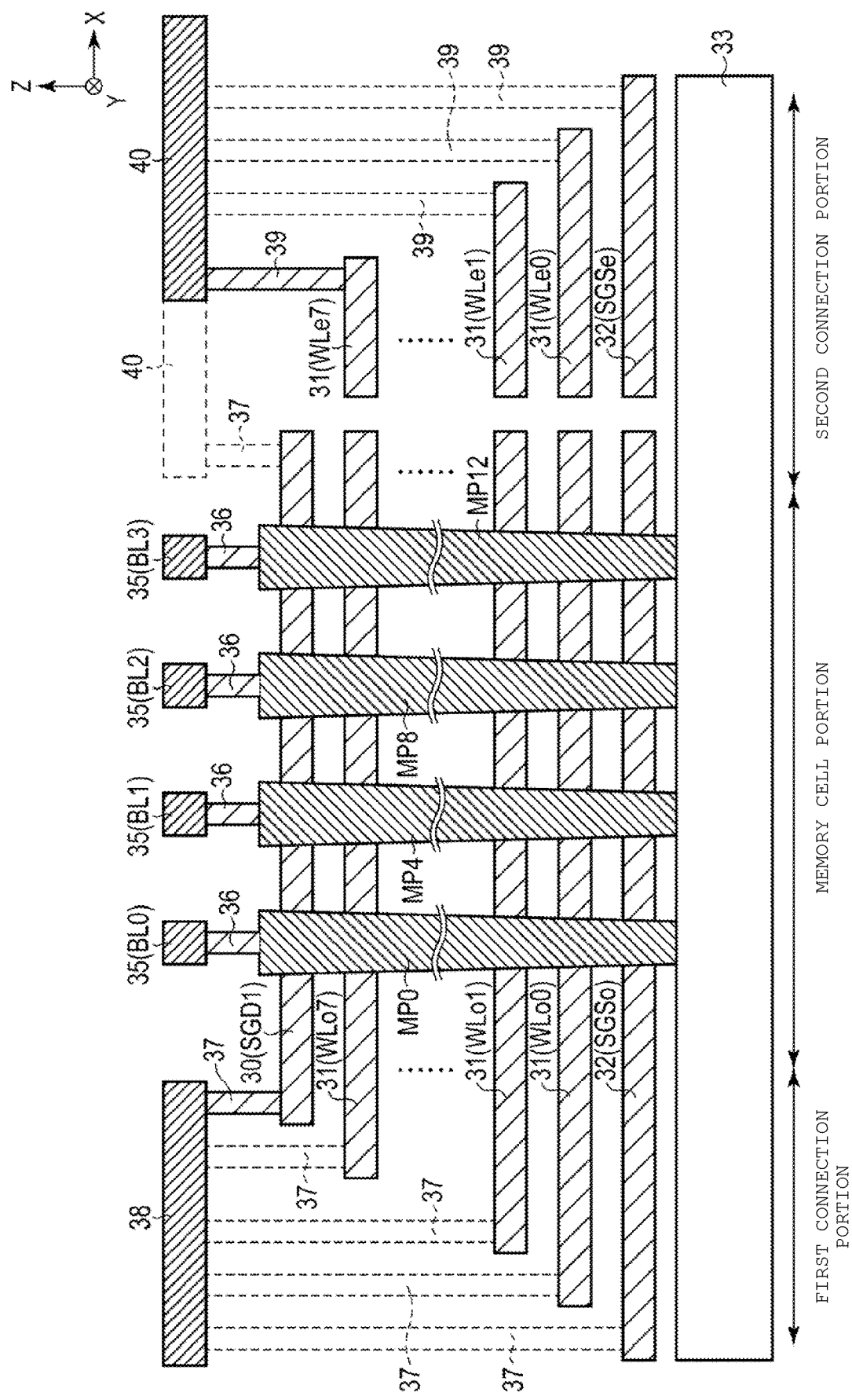

FIG. 6 is a sectional view of the block BLK along the X direction, and illustrates a sectional structure of a region which passes through the memory pillars MP0, MP4, MP8, and MP12 along the select gate line SGD1 in FIG. 3. The wiring layers 32, 31, and 30 are sequentially provided over the semiconductor substrate 33 in the same manner as described in FIG. 5. A memory cell portion is also provided in the manner as described in FIG. 5.

As illustrated in FIG. 6, the wiring layers 30 to 32 are extracted from the respective connection portions to form a stepwise shape. In other words, when viewed from the XY plane, each of the wiring layers 30 to 32 has a terrace portion not overlapped by an overlying wiring layer above its first connection portion. A contact plug 37 is provided on the terrace portion, and the contact plug 37 is connected to a metal wiring layer 38. The wiring layers 30 to 32 which function as the even select gate lines SGD0, SGD2, SGD4, and SGD6, the even word lines WLe, and the even select gate lines SGSe are electrically connected to the row decoder module 12 via the metal wiring layer 38.

Similarly, the wiring layers 30 to 32 are extracted from the respective connection portions to form a stepwise shape. In other words, when viewed from the XY plane, each of the wiring layers 30 to 32 has a terrace portion not overlapped by an overlying wiring layer above its second connection portion. A contact plug 39 is provided on the terrace portion, and the contact plug 39 is connected to a metal wiring layer 40. The wiring layers 30, 31 and 32 which function as the odd select gate lines SGD1, SGD3, SGD5, and SGD7, the odd word lines WLo, and the odd select gate lines SGSo are electrically connected to the row decoder module 12 via the metal wiring layer 40. The wiring layer 30 may be electrically connected to the row decoder module 12 via the second connection portion instead of the first connection portion, and may be connected thereto via both of the first connection portion and the second connection portion.

Structures of Memory Pillar and Memory Cell Transistor

Next, a description will be made of structures of the memory pillar MP and the memory cell transistor MT.

Figure 7:
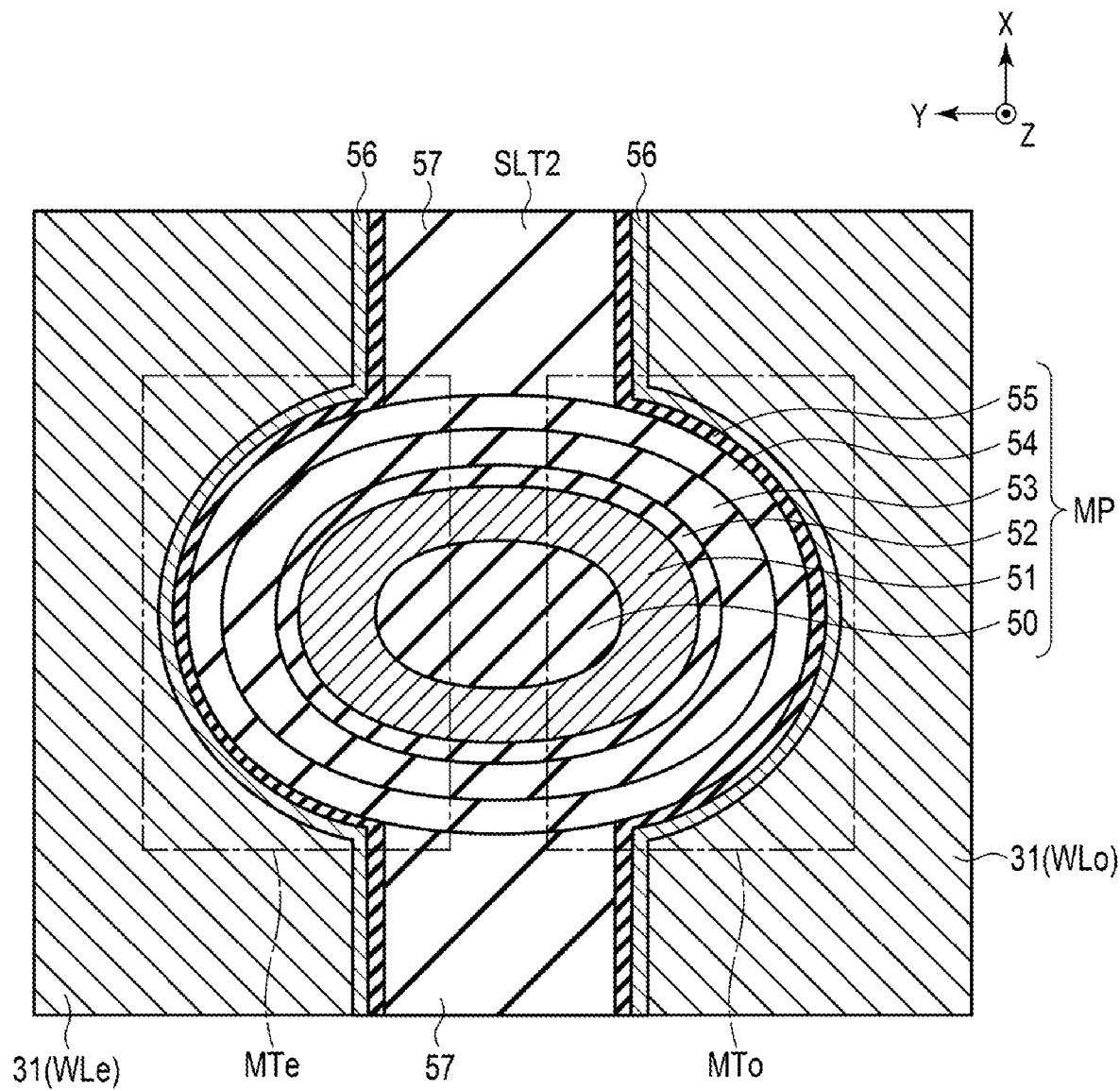
FIGS. 7-8 are each a sectional view illustrating a memory cell transistor of the first embodiment.
Figure 8:
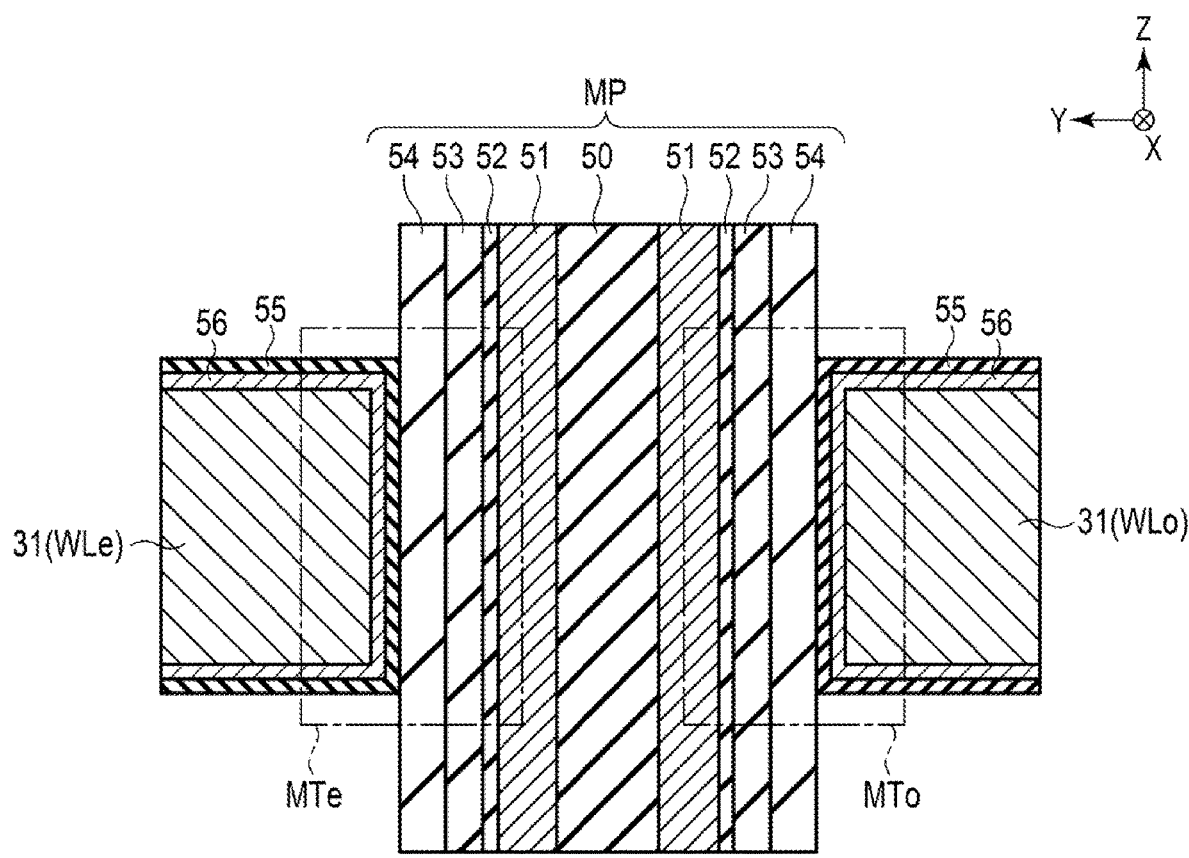

FIG. 7 is a sectional view of the memory pillar MP in the XY plane, and FIG. 8 is a sectional view of the memory pillar MP in a YZ plane. Each of FIGS. 7 and 8 illustrates a region where two memory cell transistors MT are provided.

As illustrated in FIGS. 7 and 8, the memory pillar MP includes an insulating layer 50, a semiconductor layer 51, and insulating layers 52 to 54. The word line WL includes the wiring layer 31, an insulating layer 55, and a barrier metal layer 56.

The insulating layer 50, the semiconductor layer 51, and the insulating layers 52 to 54 each extend in the Z direction. The insulating layer 50 is, for example, a silicon oxide film. The semiconductor layer 51 surrounds a side surface of the insulating layer 50, and functions as a region in which a channel of the memory cell transistor MT is formed. The semiconductor layer 51 is, for example, a polycrystalline-silicon layer.

The insulating layer 52 surrounds a side surface of the semiconductor layer 51, and functions as a gate insulating film of the memory cell transistor MT. The insulating layer 52 has, in one example, a stack structure of a silicon oxide film and a silicon nitride film. The insulating layer 53 surrounds the side surface of the semiconductor layer 51, and functions as a charge storage layer of the memory cell transistor MT. The insulating layer 53 is, for example, a silicon nitride film. The insulating layer 54 surrounds a side surface of the insulating layer 53, and functions as a block insulating film of the memory cell transistor MT. The insulating layer 54 is, for example, a silicon oxide film. An insulating layer 57 is disposed in the slit SLT2 excluding the memory pillar MP portion. The insulating layer 57 is, for example, a silicon oxide film.

The wiring layer 31 is covered with the barrier metal layer 56. The barrier metal layer 56 is covered with the insulating layer 55. The insulating layer 55 is in contact with the side surface of the insulating layer 54 and the side surface of the insulating layer 57. The wiring layer 31 contains, for example, tungsten. The barrier metal layer 56 is, for example, a TiN film.

With this configuration, in each layer of the wiring layers 31, two memory cell transistors MT face each other in the Y direction via a single memory pillar MP. The select transistors ST1 and ST2 also have the same configuration.

Equivalent Circuit of Memory Pillar

Figure 9:
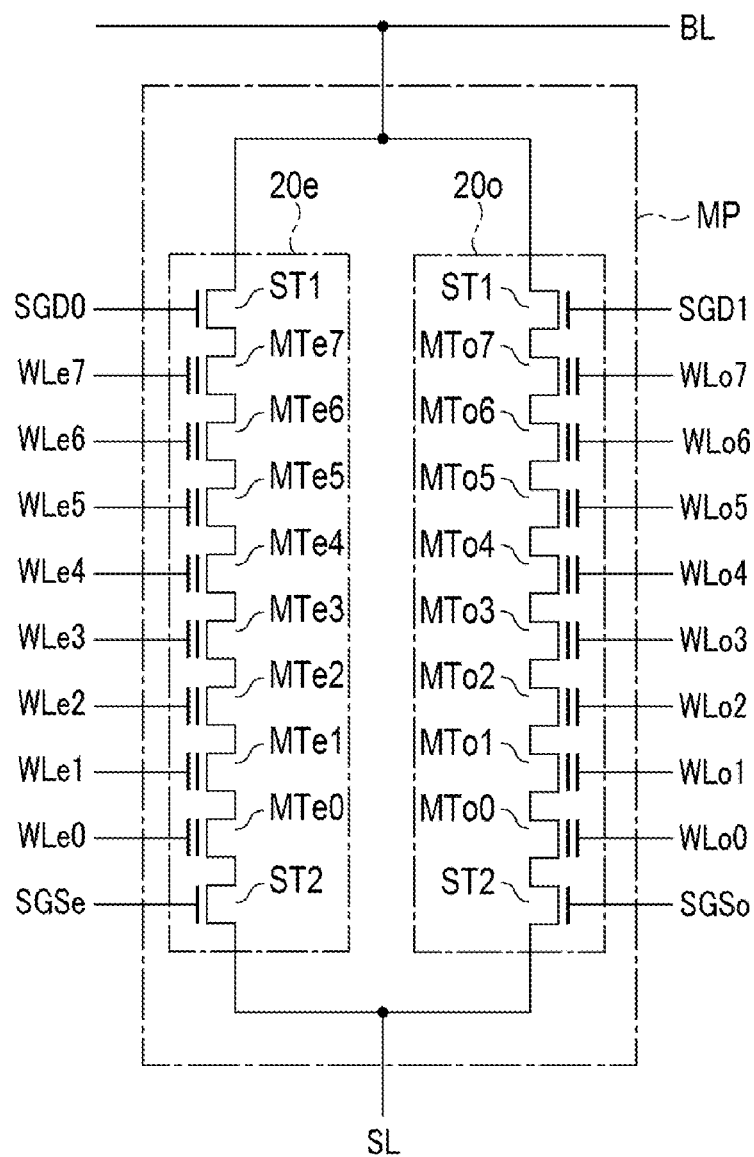
FIG. 9 is an equivalent circuit of a memory pillar of the first embodiment.

FIG. 9 is an equivalent circuit diagram of the memory pillar MP having the configuration. As illustrated, two NAND strings 20e and 20o are formed along a single memory pillar MP. In other words, the select transistors ST1 provided in the same memory pillar MP are connected to different select gate lines SGD, the memory cell transistors MT are connected to different word lines WLe and WLo, and the select transistors ST2 are also connected to different select gate line SGSe and SGSo. The NAND strings 20e and 20o in the same memory pillar MP are connected to the same bit line BL, and are connected to the same source line SL. However, current paths of the NAND strings 20e and 20o are electrically insulated from each other.

1.1.3. Threshold Voltage Distribution of Memory Cell Transistor

The memory cell transistor MT described above may store data of two or more bits by finely controlling a threshold voltage thereof. For example, when a triple-level cell (TCL) method is applied as a writing method, the memory cell transistor MT stores 3-bit data. In addition, when the TLC method is applied, the cell unit CU stores 3-page data.

Figure 10:
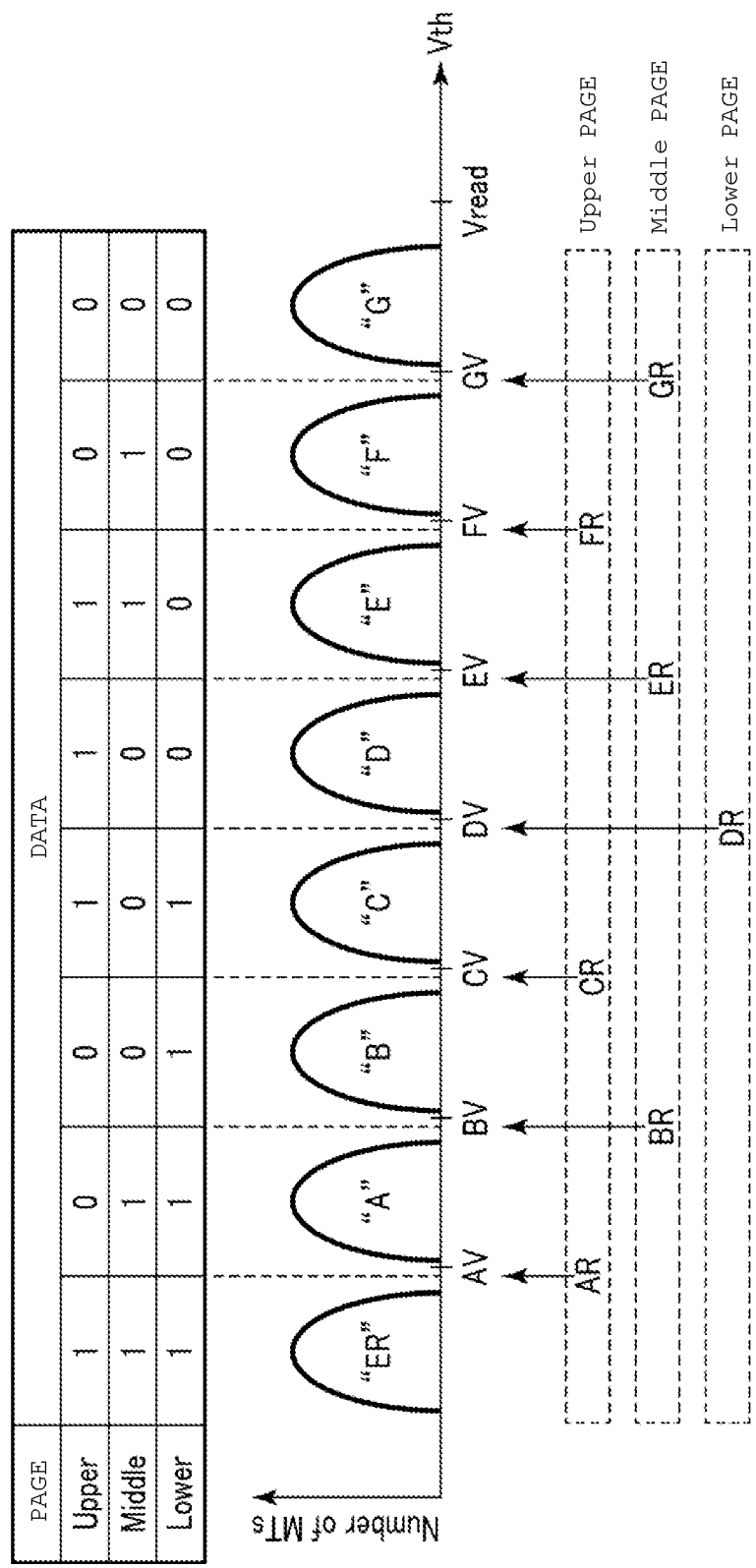
FIG. 10 is a diagram illustrating threshold voltage distributions of the memory cell transistors in the semiconductor storage device according to the first embodiment.

FIG. 10 illustrates an example of threshold voltage distributions of the memory cell transistors MT and an example of allocation of data to each of the threshold voltage distributions of the memory cell transistors MT when the TLC method (three bits/cell) is applied. The vertical axis corresponds to the number of memory cell transistors MT, and the longitudinal axis corresponds to a threshold voltage Vth of the memory cell transistor MT. As illustrated in FIG. 10, there are eight threshold voltage distributions of the memory cell transistors MT.

The eight threshold voltage distributions in the TLC method are defined as an "ER" state, an "A" state, a "B" state, a "C" state, a "D" state, an "E" state, an "F" state, and a "G" state in the order of increasing threshold voltages. 3-bit data may be allocated to each of the threshold voltage distributions.

A read voltage is set between the threshold voltage distributions adjacent to each other. For example, a read voltage AR is set between the maximum threshold voltage in the "ER" state and the minimum threshold voltage in the "A" state, and is used to detect whether a threshold voltage of the memory cell transistor MT is in the threshold voltage distribution of the "ER" state or the threshold voltage distribution of the "A" state or more. A read voltage BR is set between the maximum threshold voltage in the "A" state and the minimum threshold voltage in the "B" state, and is used to detect whether a threshold voltage of the memory cell transistor MT is included in the threshold voltage distribution of the "A" state or less or the threshold voltage distribution of the "B" state or more.

For example, when the read voltage AR is applied to the word line WL, the memory cell transistor MT in the "ER" state is brought into an ON state, and a memory cell transistor in the threshold voltage distribution of the "A" state or more is brought into an OFF state. When the read voltage BR is applied to the word line WL, the memory cell transistor MT in the threshold voltage distribution of the "A" state or less is brought into an ON state, and a memory cell transistor in the threshold voltage distribution of the "B" state or more is brought into an OFF state.

Each of other read voltages CR, DR, ER, FR, and GR is set between threshold voltage distributions adjacent to each other in the same manner as the read voltages AR and BR.

A read pass voltage VREAD is set to a voltage higher than the maximum threshold voltage in the highest threshold voltage distribution. When the read pass voltage VREAD is applied to the word line WL, the memory cell transistor MT is brought into an ON state regardless of data stored therein.

Voltages AV, BV, CV, DV, EV, FV, and GV illustrated in FIG. 10 are verification voltages used to program the "A" state, "B" state, "C" state, "D" state, "E" state, "F" state, and "G" state. The semiconductor storage device 10 is considered to pass verification as a result of detecting that a threshold voltage of the memory cell transistor MT exceeds the target verification voltage, and thus programming of the memory cell transistor MT is completed. For example, the verification voltage AV is set between the maximum threshold voltage in the "ER" state and the minimum threshold voltage in the "A" state, and is located near a lower tail of the threshold voltage distribution of the "A" state. This is also the same for the other verification voltages BV, CV, DV, EV, FV, and GV. In other words, the verification voltages AV, BV, CV, DV, EV, FV, and GV are respectively set to be higher than, for example, the read voltages AR, BR, CR, DR, ER, FR, and GR.

Data is allocated as follows according to the TLC method illustrated in FIG. 10.

"ER" state: "111" ("lower bit/middle bit/upper bit") data
"A" state: "110" data
"B" state: "100" data
"C" state: "101" data
"D" state: "001" data
"E" state: "011" data
"F" state: "010" data
"G" state: "000" data When the above data allocation is applied, in a read operation, 1-page data of lower bits (lower page data) is determined according to a reading result using the read voltage DR. 1-page data of middle bits (middle page data) is determined according to a reading result using the read voltages BR, ER, and GR. 1-page data of upper bits (upper page data) is determined according to a reading result using the read voltages AR, CR, and FR.

Detection Voltage Vdet

Figures 11, 12, 13:
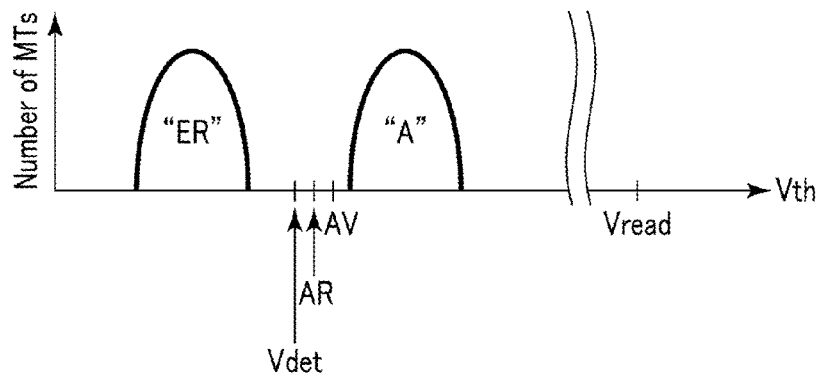
FIG. 11 is a diagram illustrating a detection voltage used in the first embodiment.
FIGS. 12-14 illustrate different examples of a writing order used in the first embodiment.

In the present embodiment, as voltages used to determine the threshold voltage Vth of the memory cell transistor MT, a detection voltage Vdet is also used in addition to the values described hitherto. FIG. 11 is a diagram illustrating magnitude relationships among the detection voltage Vdet and various other voltages. As illustrated in FIG. 11, the detection voltage Vdet is a voltage which is lower than the verification voltage AV in the "A" state and the read voltage AR in the "A" state and is higher than a voltage in the "ER" state. An operation using the detection voltage Vdet will be described later.

1.2 Write Operation

Next, a description will be made of a data write operation in the semiconductor storage device 10 having the above-described configuration.

Figures 14, 15:
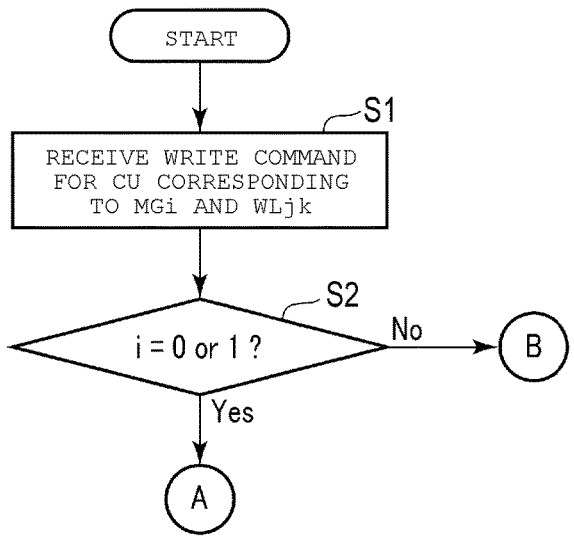
FIGS. 15-17 depict a flowchart illustrating an example of a write operation according to the first embodiment.

In the present embodiment, with reference to FIGS. 12 to 14, a description will be made of a writing order for the cell unit CU and the memory cell transistor MT in the memory cell array 11. In FIGS. 12 to 14, a writing order for the cell unit CU, related to first to third examples, is indicated by numbers of 0 to 63. In this example, the cell unit CU stores 3-page data, and writing is performed in the 3-page unit.

In FIGS. 12 to 14, a word line is indicated by "WL", and word lines WLe and WLo are not differentiated from each other. For example, the word lines WLe corresponding to the even memory groups MG0, MG2, MG4, and MG6 are represented as the word lines WL, and the word lines WLo corresponding to the odd memory groups MG1, MG3, MG5, and MG7 are also represented as the word lines WL.

First, the first example will be described with reference to FIG. 12. In this example, the word line WL0 in the lowermost layer is first selected, and corresponding page data is written into the cell units CU of each memory group MG. In this case, the even memory group MG is first selected, and then the odd memory group MG is selected.

Specifically, writing of 3-page data performed by selecting the word line WL0 in the first example is performed by selecting the even memory groups MG0, MG2, MG4, and MG6 and the odd memory groups MG1, MG3, MG5, and MG7 in this order. Consequently, writing in the state of selecting the word line WL0 is completed.

Next, the word line WL1 is selected, and data is written. In other words, the word line WL1 is selected, and the memory groups MG0, MG2, MG4, and MG6 are sequentially selected, and then the memory groups MG1, MG3, MG5, and MG7 are sequentially selected. Thereafter, the word line WL2 is selected, and the same operation is performed.

Next, the second example will be described with reference to FIG. 13. In this example, the word line WL0 in the lowermost layer is first selected, and corresponding page data is written into the cell units CU of the even memory group MG. In this case, the odd memory group MG is not selected.

Specifically, writing of 3-page data performed by selecting the word line WL0 in the second example is performed by first selecting the even memory groups MG0, MG2, MG4, and MG6 in this order. When writing on the cell units CU of the even memory group MG performed by selecting the word line WL0 is completed, subsequently, writing on the cell units CU of the even memory group MG performed by selecting the word line WL1 is sequentially performed. Subsequently, in the same manner, the word lines WL2 to WL7 are selected, and writing on the cell units CU of the even memory group MG is sequentially performed.

When writing on the cell units CU of the even memory group MG is completed up to the word line WL7, subsequently, writing of 3-page data performed by selecting the word line WL0 is performed by selecting the odd memory groups MG1, MG3, MG5, and MG7 in this order. When writing on the cell units CU of the odd memory group MG performed by selecting the word line WL0 is completed, subsequently, writing on the cell units CU of the odd memory group MG performed by selecting the word line WL1 is sequentially performed. Subsequently, in the same manner, the word lines WL2 to WL7 are selected, and writing on the cell units CU of the odd memory group MG is sequentially performed.

Finally, the third example will be described with reference to FIG. 14. In this example, the word line WL0 in the lowermost layer is first selected, and corresponding page data is written into the cell units CU of each memory group MG. In this case, the even memory group MG the odd memory group MG are alternately selected.

Specifically, writing of 3-page data performed by selecting the word line WL0 in the third example is performed by selecting the memory groups MG0, MG1, MG2, MG3, MG4, MG5, MG6, and MG7 in this order. Next, writing performed by selecting the word line WL1 is performed by alternately selecting the even memory group MG and the odd memory group MG in the same manner as in the word line WL0. Subsequently, in the same manner, the word lines WL2 to WL7 are selected, and writing is performed by alternately selecting the even memory group MG and the odd memory group MG.

Figure 16:
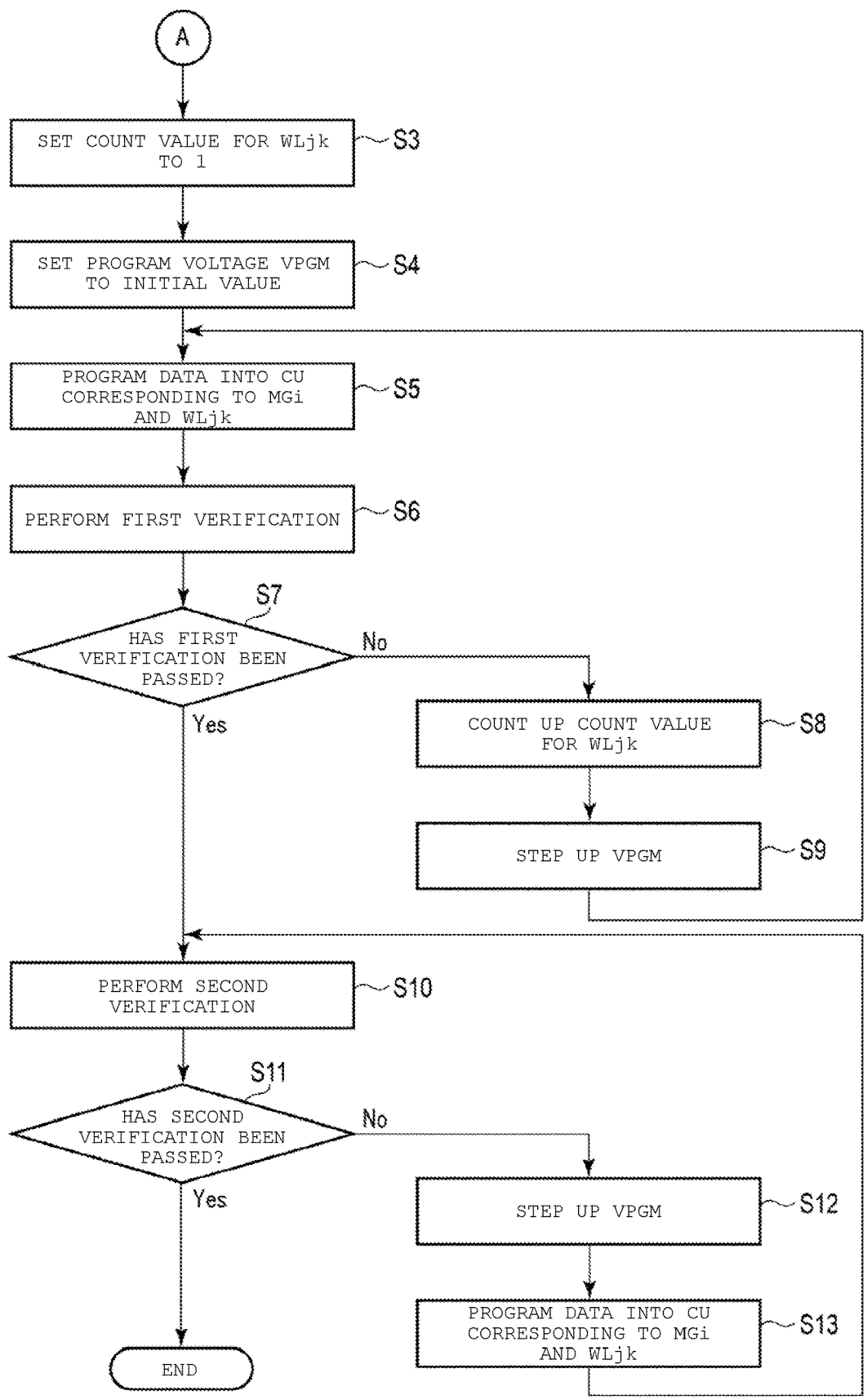
Figure 17:
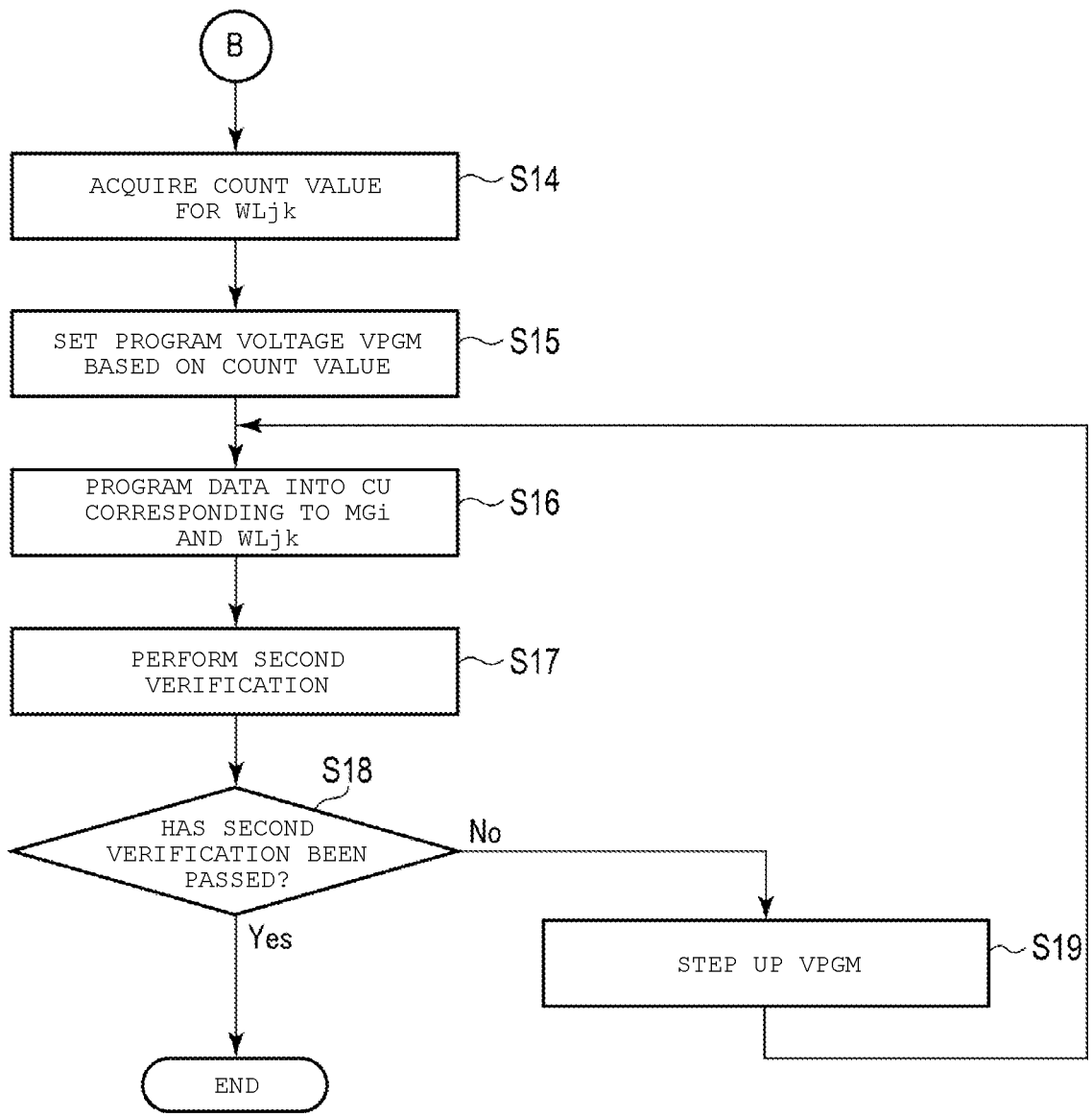

Next, a data writing method will be described with reference to FIGS. 15 to 17. FIGS. 15 to 17 are flowcharts illustrating a data writing method in the first embodiment. A write operation shown in the flowchart is continuously performed in the order described in FIG. 12. This is also the same for the cases of FIGS. 13 and 14.

The write operation includes a program operation of increasing a threshold voltage by injecting electric charge into a charge storage layer, and a verify operation of verifying a threshold voltage which is changed as a result of the program operation. The semiconductor storage device 10 repeatedly performs a set of the operations (referred to as a software program loop), and thus writes data. Processes illustrated in FIGS. 15 to 17 are generally performed under the control of the sequencer 17.

As illustrated, the semiconductor storage device 10 receives a write command. The write command includes address information, and specifies to which memory group MG (memory group MGi) a write target cell unit CU belongs, wherein the memory group MG is an even memory group MG or an odd memory group MG, and the cell unit CU corresponds to a word line WLk in a k-th layer. Hereinafter, with respect to the write target cell unit CU, a number of the memory group MG is indicated by "i", even or odd is indicated by "j", a layer of the word line WL is indicated by "k", and expressions "MGi and WLjk" are used. Each of the variables i and k is an integer of 0 or greater. The sign j is "e (even)" in a case of corresponding to an even memory group MG, and is "o (odd)" in a case of corresponding to an odd memory group MG.

The sequencer 17 refers to the address register 15B and the command register 15C, and thus detects that a write target is the memory cell transistor MT corresponding to the memory group MGi and the word line WLjk (step S1). In the example illustrated in FIG. 12, first writing is performed when i=0, j=e, and k=0.

The sequencer 17 determines whether or not the variable i is 0 or 1 in the subsequent step S2. Hereinafter, in the process in step S2, a case where the variable i is 0 or 1 and a case where the variable i is not 0 or 1 will be described in order.

First, a description will be made of the case where the variable i is 0 or 1 in step S2. When the variable i is 0 or 1 in step S2 (YES in step S2), as illustrated in FIG. 16, the sequencer 17 sets a count value for WLjk in the writing information register 15D to 1 (step S3).

Figure 18:
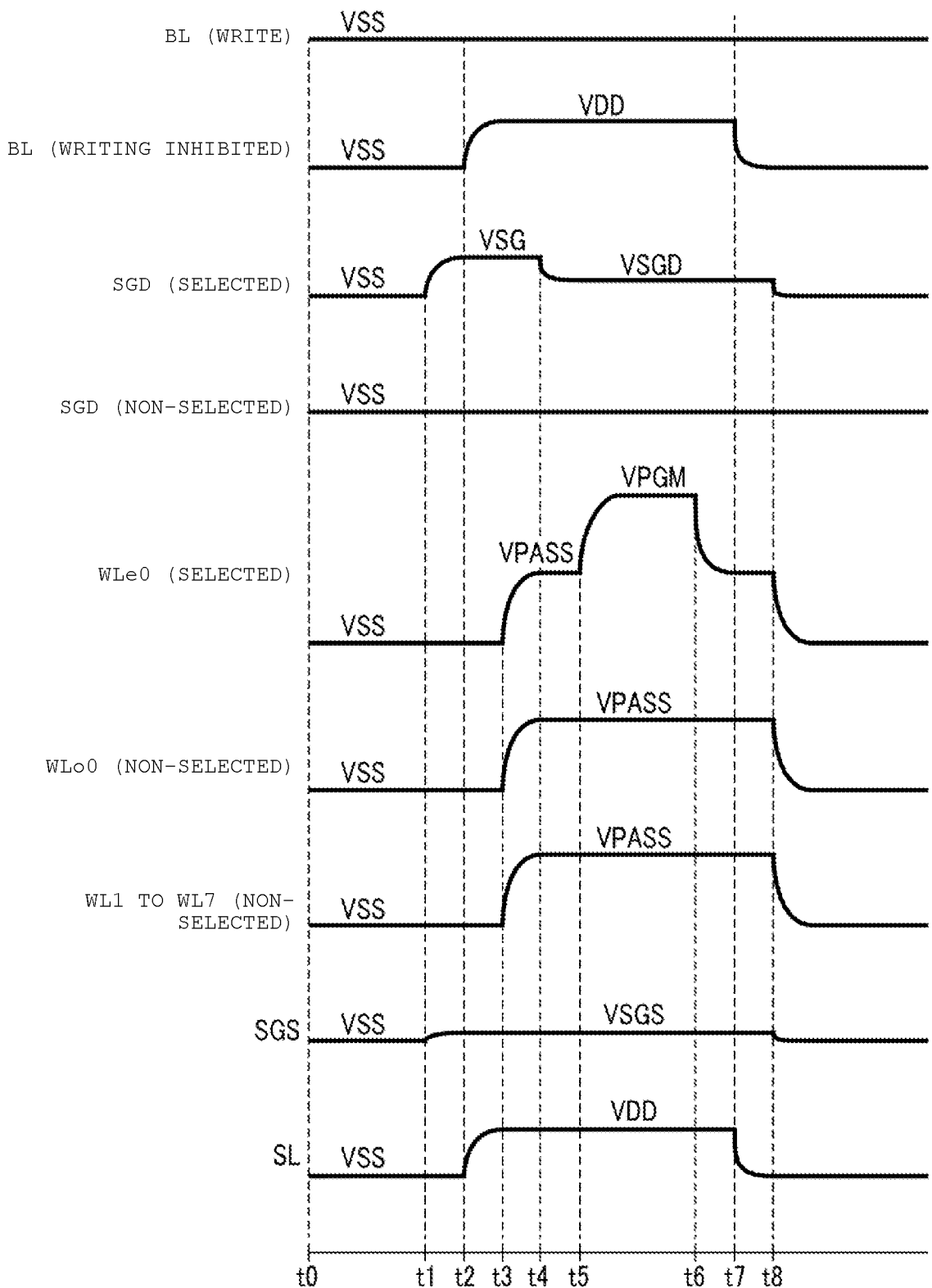
FIG. 18 is a timing chart of various signals during a program operation according to the first embodiment.

Next, the sequencer 17 sets a program voltage VPGM to an initial value VPGMinit (step S4), and data is programmed into the cell unit CU corresponding to the memory group MGi and the word line WLjk (step S5). The initial value VPGMinit is the program voltage VPGM applied to a selected word line during an initial program operation in the software program loop. Such a programming state is illustrated in FIG. 18. FIG. 18 is a timing chart illustrating voltage changes of various wirings when step S5 is executed in a state in which WLe0 is selected as an example.

As illustrated in FIG. 18, at a time point t1, the row decoder module 12 applies a voltage VSG to the select gate line SGD of the selected memory group MG. The voltage VSG is a voltage turning on the select transistor ST1. Consequently, the select transistor ST1 connected to the select gate line SGD is brought into an ON state. The row decoder module 12 applies a voltage VSGS to the select gate line SGS of the selected memory group MG. The voltage VSGS is a voltage higher than, for example, a voltage VSS, but does not turn on the select transistor ST2.

Subsequently, at a time point t2, the sense amplifier module 13 applies a voltage VDD to a bit line inhibited from being programmed. The voltage generation circuit 19 applies the voltage VDD to the source line SL.

At a time point t3, the row decoder module 12 applies a voltage VPASS to all the word lines WL of the selected block BLK. The voltage VPASS is a voltage which turns on the memory cell transistor MT regardless of data stored therein, and can sufficiently increase a channel voltage through coupling in the non-selected NAND string 20.

At a time point t4, the row decoder module 12 applies a voltage VSGD to the select gate line SGD of the selected memory group MG. The voltage VSGD is a voltage lower than the voltage VSG, and when the voltage VDD is applied to the bit line, the select transistor ST1 is cut off.

At a time point t5, the row decoder module 12 applies a voltage VPGM to only the selected word line, that is, WLe0 in this example. The voltage VPGM is a high voltage for injecting electrons into the charge storage layer through FN (Fowler-Nordheim) tunneling. The voltage VPGM is higher than the voltage VPASS.

At a time point t6, the row decoder module 12 applies the voltage VPASS to the selected word line.

At a time point t7, the row decoder module 12 applies the voltage VSS to the bit line inhibited from being programmed. The voltage generation circuit 19 applies the voltage VSS to the source line SL.

At a time point t8, the row decoder module 12 applies the voltage VSS to the select gate line SGD and the select gate line SGS, and applies the voltage VSS to all of the word lines WL.

Consequently, the electrons are injected into the charge storage layer, and thus a threshold voltage of the memory cell increases toward the positive side.

The description will be continued with reference to FIG. 16. After the process in step S5 is performed, the sequencer 17 performs a first verify operation (step S6).

A verify operation in the present embodiment includes the first verify operation and a second verify operation which will be described later. The first verify operation is performed to determine suitable VPGMinit when a program operation is performed. In the first verify operation, the semiconductor storage device 10 uses the voltage Vdet described in FIG. 11 as a verification voltage in order to retrieve this VPGMinit.

Figure 19:
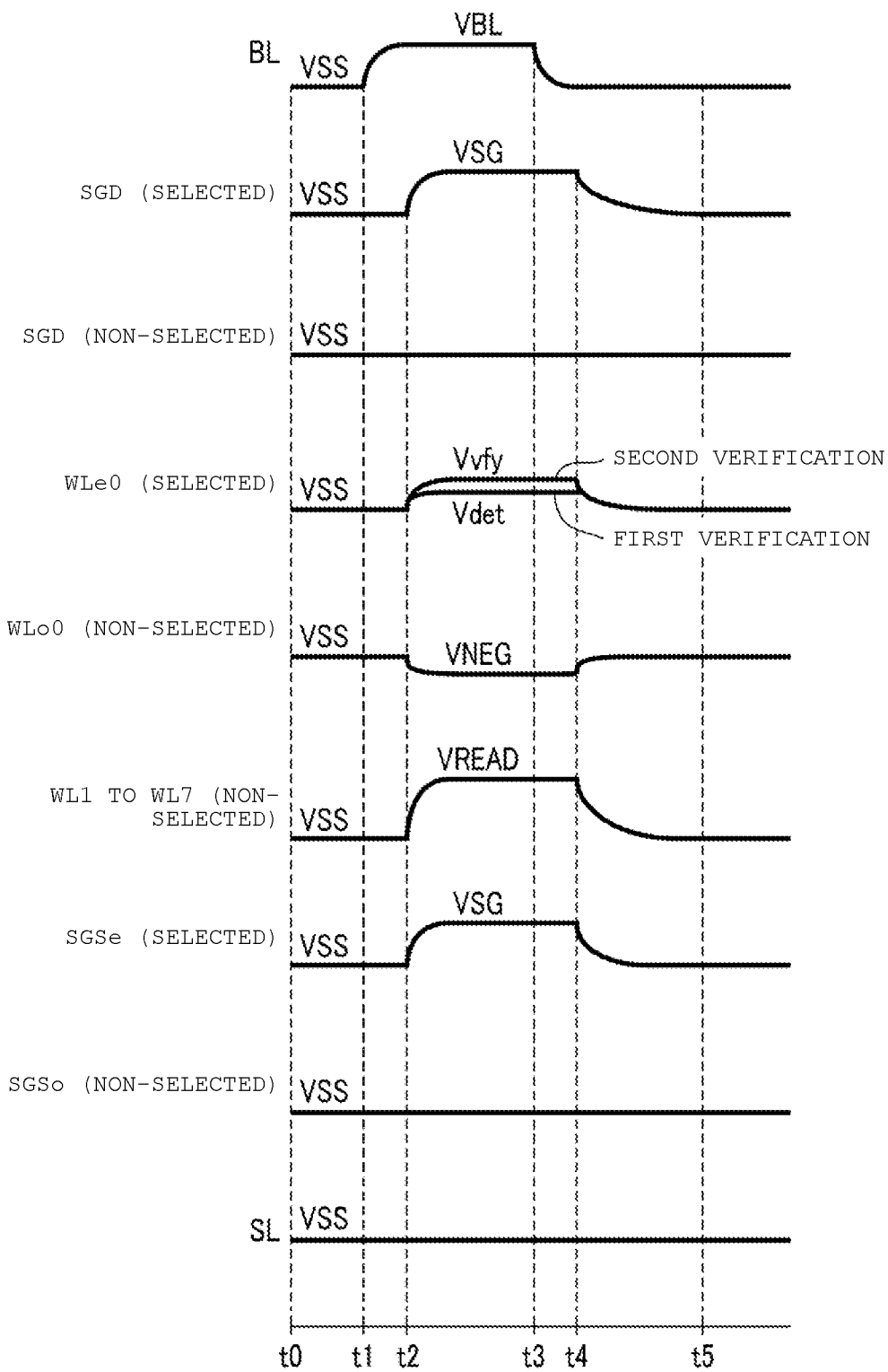
FIG. 19 is a timing chart of various signals during a verify operation according to the first embodiment.

Here, details of the first verify operation will be described with reference to FIG. 19. FIG. 19 is a timing chart illustrating examples of voltage changes of various wirings in a state in which the word line WLe0 is selected in the first verify operation.

As illustrated in FIG. 19, at a time point t1, the sense amplifier module 13 applies a voltage VBL to the bit line BL.

Next, at a time point t2, the row decoder module 12 applies the voltage VSG to the select gate line SGD of the selected string. The row decoder module 12 applies the detection voltage Vdet to the selected word line, that is, WLe0 in this example, and applies a voltage VNEG to a non-selected word line of the same layer as the selected word line, that is, WLo0. The voltage VNEG is, for example, a negative voltage or 0 V, and is a voltage turning off the memory cell transistor MT. The row decoder module 12 applies a voltage VREAD to word lines in other layers, that is, WL1 to WL7, and applies the voltage VSG to the select gate line SGS, that is, SGSe in this example. The sense amplifier module 13 detects whether or not a cell current flows from the bit line BL to the source line SL.

Thereafter, at a time point t3, the sense amplifier module 13 applies the voltage VSS to the bit line BL. The row decoder module 12 applies the voltage VSS to the select gate lines SGD and SGS and all of the word lines WL.

The row decoder module 12 applies the voltage VSS to the select gate lines SGD and SGSo of the non-selected string from the time point t0 to the time point t5. The voltage generation circuit 19 applies the voltage VSS to the source line SL from the time point t0 to the time point t5.

As a result of the above operations, when a cell current flows from the bit line BL to the source line SL (NO in step S7), this means that the threshold voltage Vth of the write target memory cell transistor MT has not increased to Vdet. Therefore, the sequencer 17 counts up a count value of WLjk in the writing information register 15D (step S8), steps up VPGM (step S9), and returns to step S5. In other words, the sequencer 17 repeatedly performs the program operation described in FIG. 18.

On the other hand, in step S6, when a cell current does not flow from the bit line BL to the source line SL (YES in step S7), the sequencer 17 performs the second verify operation (step S10).

The second verify operation is performed to verify whether or not a threshold voltage increased due to the program operation exceeds a target voltage corresponding to write data. A voltage for each wiring in the second verify operation is the same as that in the first verify operation except that a voltage applied to a selected word line is changed to a verification voltage Vvfy from the detection voltage Vdet in FIG. 19 illustrated in the first verify operation. The verification voltage Vvfy corresponds to the verification voltage AV or the like described in FIG. 10.

The types and the number of verification voltages to be applied in the second verify operation may be changed as appropriate on the basis of the progress of a write operation. The memory cell transistor MT of which the threshold voltage Vth exceeds a target verification voltage is set to writing inhibition in the subsequent software program loop, and an increase in the threshold voltage thereof is prevented.

When the second verify operation fails, that is, writing on the selected cell unit CU is not completed (NO in step S11), the sequencer 17 steps up the program voltage VPGM (step S12), and executes the software program loop again. In other words, the sequencer 17 performs a program operation in which VPGM is stepped up (step S13), returns to step S10, and performs the second verify operation.

On the other hand, when the second verify operation passes, that is, writing on the selected cell unit CU is completed (YES in step S11), the sequencer 17 finishes the write operation in which the cell unit CU is selected.

Next, a description will be made of the case where the variable i is not 0 or 1 in step S2. In step S2, in the case where the variable is not 0 or 1 (NO in step S2), that is, the selected memory group MG is any one of the memory groups MG2 to MG7, the sequencer 17 acquires a count value of WLjk from the writing information register 15D (step S14). When a writing order is the order described in FIG. 12 and when the variable i is 2 or more, the write operation is executed after the write operation when the variable i is 0 or 1. Thus, the sequencer 17 can acquire a count value of WLjk which is counted when the variable i is 0 or 1. This operation is also the same for the writing order illustrated in each of FIGS. 13 and 14.

Next, the sequencer 17 sets the program voltage VPGMinit based on the acquired count value (step S15). In other words, the sequencer 17 uses the program voltage based on the value counted during writing on the cell unit CU of WLek of the memory group MG0 in writing on the cell units CU of WLek of the even memory groups MG other than the memory group MG0. Similarly, the sequencer 17 uses the program voltage based on the value counted during writing on the cell unit CU of WLok of the memory group MG1 in writing on the cell units CU of WLok of the odd memory groups MG other than the memory group MG1.

The sequencer 17 programs data into the cell unit CU corresponding to the memory group MGi and the word line WLjk (step S16). Subsequently, the sequencer 17 performs the second verify operation without performing the first verify operation (step S17). When the second verify operation has failed (NO in step S18), the program voltage VPGM is stepped up (step S19), and the flow returns to step S16. On the other hand, when the second verify operation has been passed (YES in step S18), the write operation is finished, or data is written into the next cell unit CU on the basis of the order described in FIG. 12.

FIG. 20 is a conceptual diagram illustrating count values for all of the word lines WL0 to WL7 that are stored in the writing information register 15D. In the example illustrated in FIG. 20, a count value of 3 is stored for the word line WLe0, a count value of 5 is stored for the word line WLo0, and the rest are as illustrated.

FIG. 20 illustrates an example in which the writing information register 15D stores count values for all of the word lines WL. However, in the present embodiment, an element stored in the writing information register 15D is not limited thereto. For example, in a write operation based on the example illustrated in FIGS. 12 and 13, a count value acquired in a zeroth write operation is used for first, second, and third write operations. Therefore, it no longer needs to store the count value acquired in the zeroth write operation, at the time at which the third write operation is completed. In the example illustrated in FIG. 14, a count value acquired in a zeroth write operation may be used for second, fourth, and sixth write operations, and a count value acquired in a first write operation may be used for third, fifth, and seventh write operations. Therefore, it may no longer needs to store the count value acquired in the zeroth write operation, at the time at which the sixth write operation is completed, and it no longer needs to store the count value acquired in the first write operation, at the time at which the seventh write operation is completed. As mentioned above, the operation of the present embodiment can be performed even though count values for all of the word lines WL are not continuously held.

The program voltage VPGMinit is determined on the basis of the count values illustrated in FIG. 20 in programming after the memory group MG2. In other words, since a count value is "3" in a case of the word line WLe0, a program voltage used in a third software program loop for the memory group MG0 is used as VPGMinit for the memory group MG2 and the subsequent memory groups MG. Similarly, since a count value is "5" in a case of the word line WLo0, a program voltage used in a fifth software program loop for the memory group MG1 is used as VPGMinit for the memory group MG3 and the subsequent memory groups MG. The same applies hereinafter.

Figure 21:
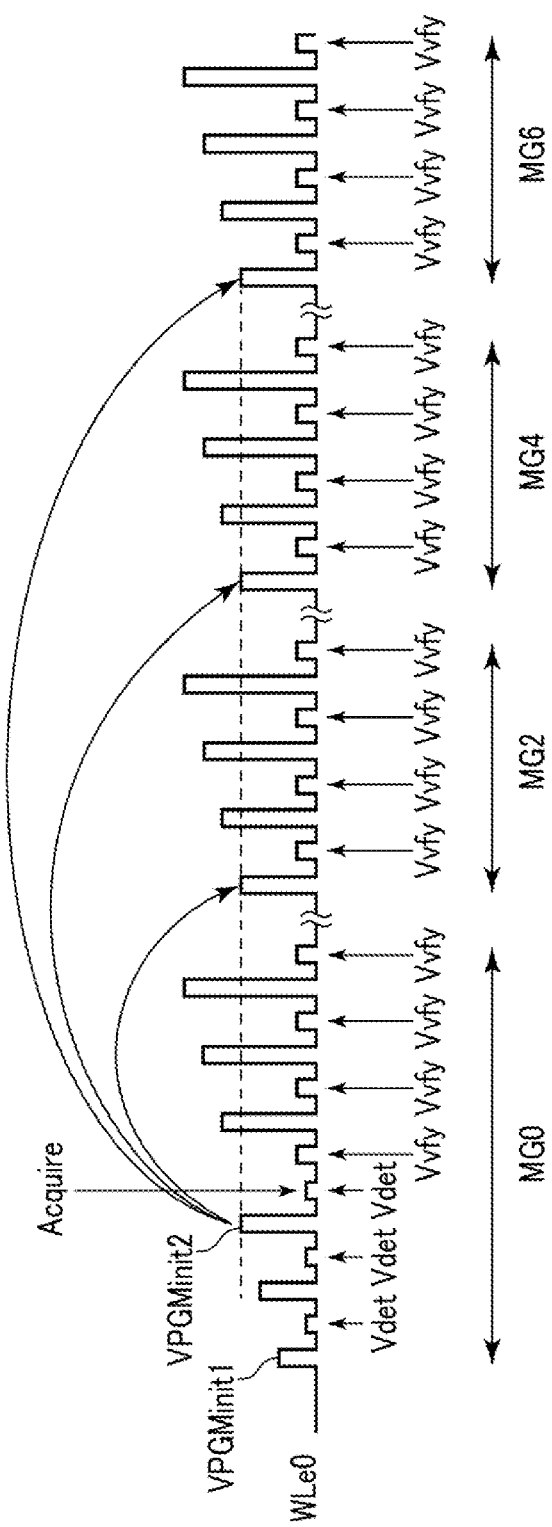
FIG. 21 is a diagram illustrating an example of a waveform of voltages applied to a word line during a write operation according to the first embodiment.

FIG. 21 is a schematic diagram illustrating a voltage change of the word line WLe0 during data writing. FIG. 21 illustrates a voltage change of a selected word line in programming, first verification, and second verification when the same data is written into the even memory groups MG from the memory group MG0 to the memory group MG6 in the order illustrated in FIG. 12. For simplification of description, one voltage value is illustrated for the second verification, but, actually, verification for each level may be performed with different voltage values as appropriate. In the memory group MG0, VPGMinit1 is used in a first software program loop, the first verification is passed in third programming, and the second verification is passed in sixth programming. In contrast, in the memory groups MG2, MG4, and MG6, programming is started with VPGMinit2 higher than VPGMinit1 used for the memory group MG0, only the second verification is performed without performing the first verification, and the second verification is passed in fourth programming.

Figure 22:
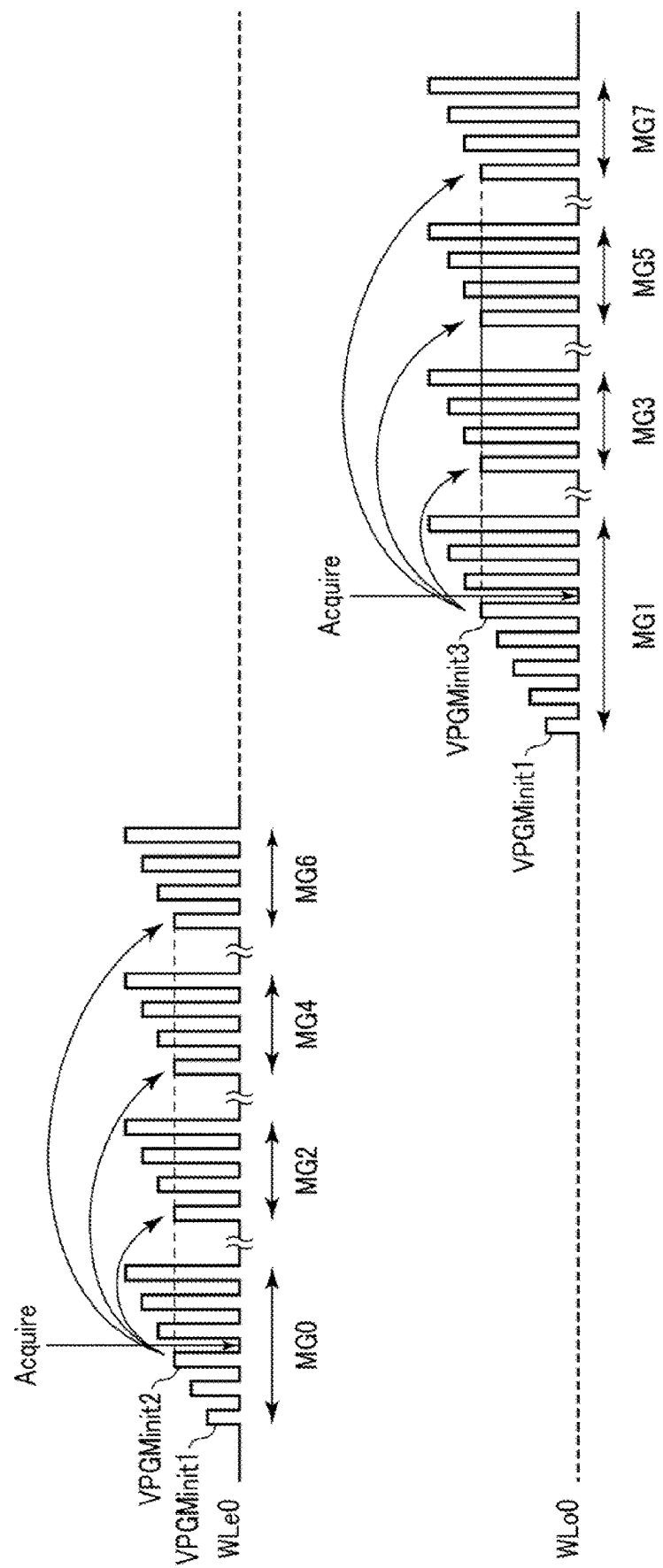
FIG. 22 is a diagram illustrating an example of a waveform of voltages applied to two word lines during a write operation according to the first embodiment.

FIG. 22 is a schematic diagram illustrating voltage changes of the word lines WLe0 and WLo0 during data writing. FIG. 22 illustrates voltage changes regarding programming when the same data is written from the memory group MG0 to the memory group MG7 in the order illustrated in FIG. 12. For simplification of description, only voltage changes regarding programming are illustrated, and voltage changes regarding the first verification and the second verification are not illustrated. The word line WLe0 is the same as that in FIG. 21. On the other hand, for the word line WLo0, in the memory group MG1, the first verification is passed in fifth programming, and the second verification is passed in eighth programming. In contrast, in the memory groups MG3, MG5, and MG7, programming is started with VPGMinit3 which is higher than VPGMinit1 applied to the memory groups MG0 and MG1 and is different from VPGMinit2 applied to the memory groups MG2, MG4, and MG6, and the second verification is passed in fourth programming.

The example illustrated in FIG. 22 shows a case where there is a difference between writing characteristics of the even memory cell transistor MTe and the odd memory cell transistor MTo. When characteristics of the even memory cell transistor MTe and the odd memory cell transistor MTo are the same, VPGMinit2 applied to the memory group MG2 may be the same as VPGMinit3 applied to the memory group MG3.

In the present embodiment, as a method of determining the write voltage VPGMinit based on a count value, a description has been made of an example of a method in which a program voltage applied at the N-th time is used when a count value is not used when the count value is N. However, a method of determining the write voltage VPGMinit based on a count value is not limited thereto, and various methods may be used.

1.3 Effect Related to First Embodiment

According to the first embodiment, it is possible to correct a variation between memory cell characteristics and to improve an operation speed of the semiconductor storage device. This effect will be described below.

In the memory cell transistor MT, a characteristic variation may occur depending on a variation between sizes of the memory cell transistors MT. With reference to FIGS. 3 to 5, a description will be made of a size of the memory cell transistor MT.

First, a description will be made of a size difference in the XY plane. Referring to FIGS. 3 and 4, a difference may occur in positional relationships between the memory pillar MP and two corresponding word lines WLe and WLo. In the example illustrated in FIGS. 3 and 4, the memory pillar MP0 overlaps the wiring layers 30-0 and 31-0 by a distance d1, and overlaps the wiring layers 30-1 and 31-1 by a distance d2. A relationship of d1>d2 is established. In this case, a cell size of the memory cell transistor MTe corresponding to the word line WLe is larger than a cell size of the memory cell transistor MTo corresponding to the word line WLo. As mentioned above, a cell size of the memory cell transistor MT changes depending on positional relationships between the memory pillar MP and the word lines WLe and WLo in contact with the memory pillar MP.

Next, a description will be made of a difference between sizes in the Z axis direction. As described in FIG. 5, for example, a diameter of the memory pillar MP is gradually reduced from the upper layer side toward the lower layer side. In other words, a cell size of the memory cell transistor MT differs in each layer of the word line.

As mentioned above, there is a variation in a cell size of the memory cell transistor MT, but it can be expected that the variation is substantially uniform in the same block BLK. In other words, in the same block BLK, it can be expected that a difference in the memory pillar MP in the XY plane is substantially uniform, and a shape thereof is also substantially uniform. Therefore, it can be expected that, in a certain block BLK, a variation occurring in characteristics of the even memory cell transistor MTe or the odd memory cell transistor MTo in the same layer can be prevented.

Therefore, in the semiconductor storage device according to the present embodiment, as described in FIGS. 15 to 17, in the block BLK, for the even and odd memory groups MG on which first writing is performed, a count value of a software program loop required to pass the first verify operation is stored in the writing information register 15D. In other words, writing characteristics of the cell unit CU are measured by using a software program loop accompanied by the first verify operation, and are stored in the writing information register 15D.

When writing is subsequently performed on other memory groups MG, the count value stored in the writing information register 15D is acquired, and the program voltage VPGMinit based on the count value is set. In other words, the write voltage VPGMinit appropriate for the characteristics can be set without measuring writing characteristics of the write target cell unit CU through the first verify operation.

Here, with reference to FIGS. 21 and 22, a description will be made of an example of a change of the write voltage VPGMinit in a write operation of the semiconductor storage device 10 according to the first embodiment.

In the example illustrated in FIG. 21, writing characteristics are acquired in the memory group MG0 on which first writing is performed, and the program voltage VPGMinit2 is used for the memory group MG2 and the subsequent memory groups MG. As a result, the number of loops required for writing on the memory group MG2 and the subsequent memory groups MG is reduced from six to four.

In the example illustrated in FIG. 22, in the odd memory groups MG, writing characteristics are acquired in the memory group MG1 on which first writing is performed, and the program voltage VPGMinit3 is used for the memory group MG3 and the subsequent memory groups MG. As a result, the number of loops required for writing on the memory group MG3 and the subsequent memory groups MG is reduced from eight to four.

As mentioned above, the semiconductor storage device according to the first embodiment can use the write voltage VPGMinit appropriate for characteristics of each cell unit CU. Therefore, the semiconductor storage device 10 according to the first embodiment can reduce the number of software program loops while preventing deterioration in operation reliability, and can thus improve an operation speed of the semiconductor storage device.

2. Second Embodiment

Next, a description will be made of a semiconductor storage device according to a second embodiment. A semiconductor storage device 10 according to the second embodiment has the same configuration as that of the semiconductor storage device 10 of the first embodiment, and is different from that in terms of a write operation method. Hereinafter, only differences from the first embodiment will be described.

2.1 Write Operation

A write operation in the second embodiment includes estimation of a count value. Specifically, examples of a mechanism to obtain a count value include not only the first verify operation but also an operation of estimating a count value not acquired from an acquired count value. In the present embodiment, as an example, a description will be made of a method of estimating a count value by using a difference.

Figures 23, 24:
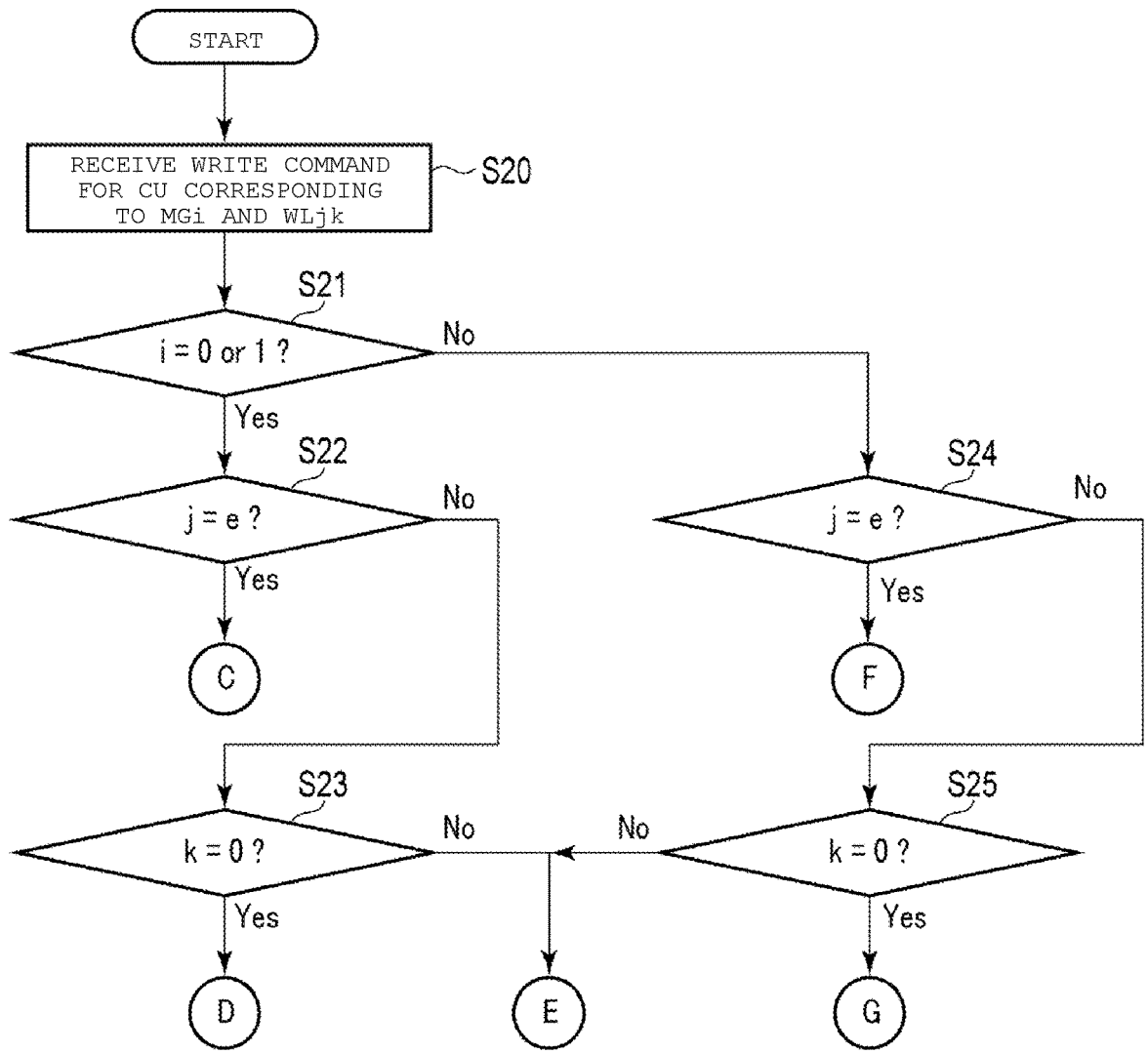
FIG. 23 is a conceptual diagram illustrating information stored in a writing information register of a second embodiment.
FIGS. 24-27 depict a flowchart illustrating a write operation according to the second embodiment.
Figure 25:
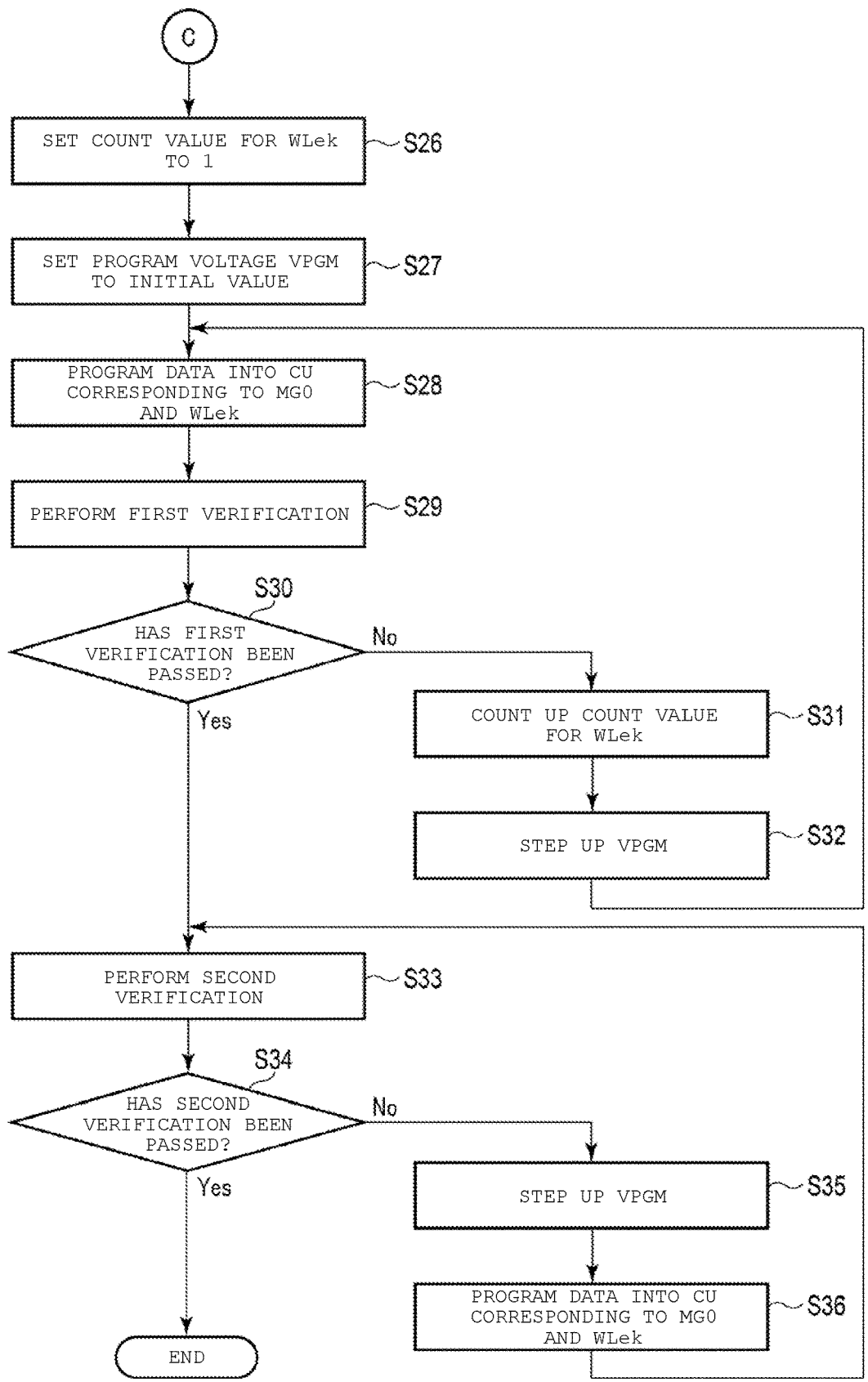
Figure 26:
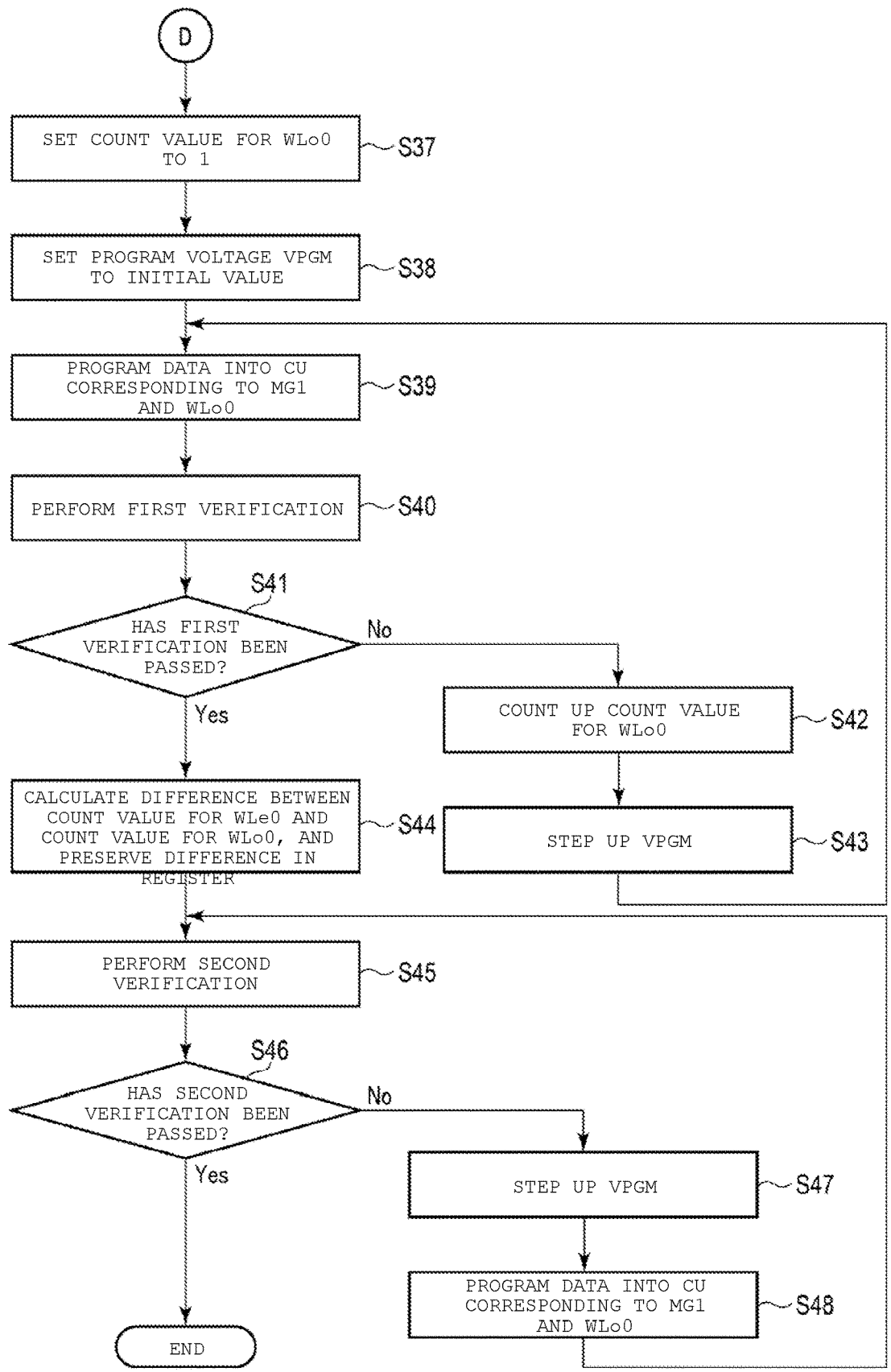
Figure 27:
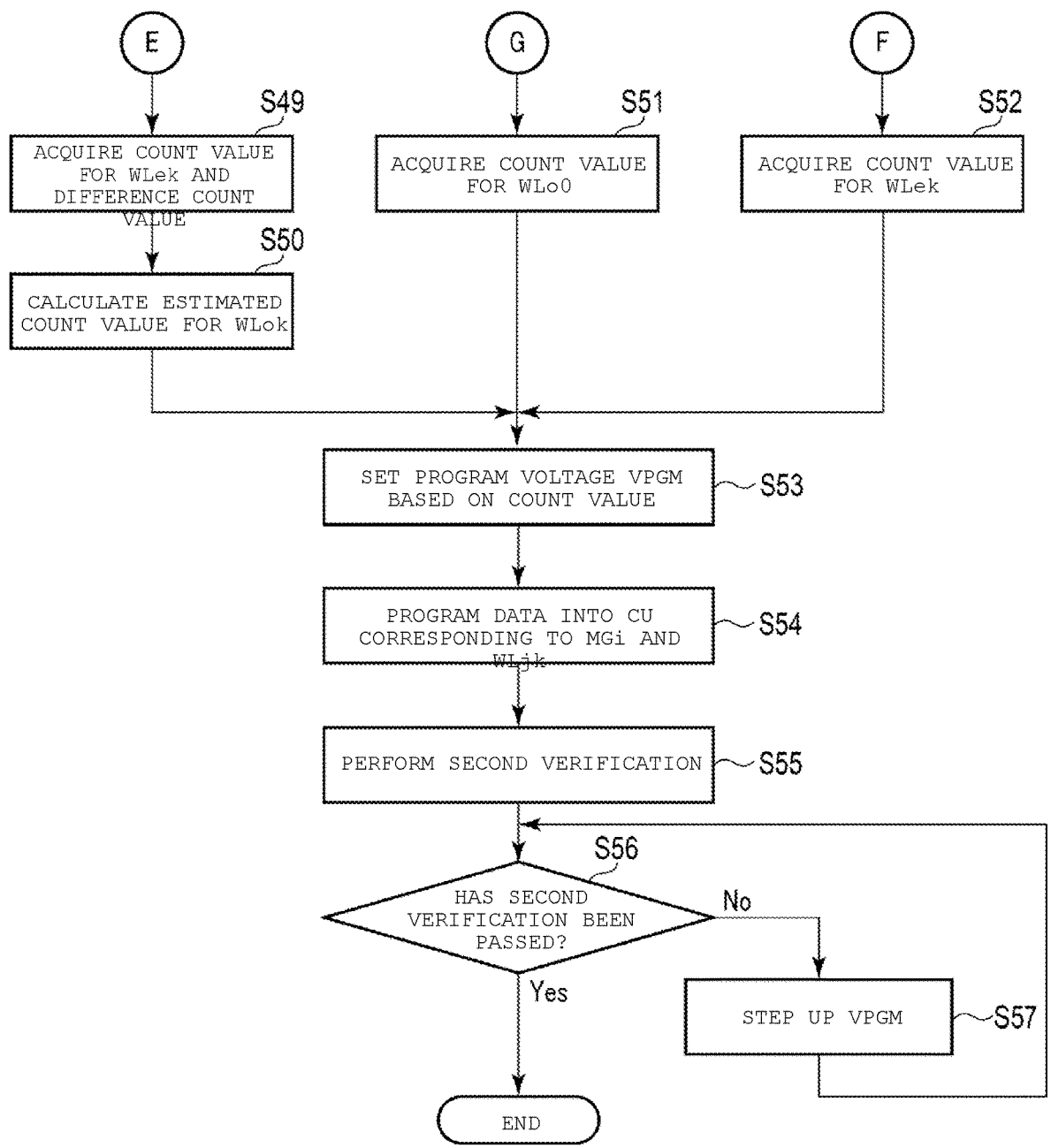

With reference to FIG. 23, an example of a difference will be described. A difference is managed, for example, in the same table as that of a count value. In the example illustrated in FIG. 23, count values for all of the even word lines WLe0 to WLe7, a count value for WLo0, and a difference between the count value for WLe0 and the count value for WLo0 are stored in the writing information register 15D. In the example illustrated in FIG. 23, the count value of 3 is stored for the word line WLe0, the count value of 5 is stored for the word line WLo0, the count value of 4 is stored for the word line WLe1, and the values as illustrated are stored for the word lines WLe2 to WLe7. The count value of +2 is stored for the difference.

Next, a data writing method will be described with reference to FIGS. 24 to 27. FIGS. 24 to 27 are flowcharts illustrating a data writing method in the second embodiment.

As illustrated in FIGS. 24 to 27, the semiconductor storage device 10 receives a write command (step S20), and the sequencer 17 performs a write operation corresponding to the write target memory group MG and word line WL.

Specifically, when the variable i is 0 or 1 in step S21 (YES in step S21), subsequently, the sequencer 17 determines whether or not the sign j is "e" (step S22).

When j is e in step S22 (YES in step S22), the sequencer 17 transitions to a process in step S26, and performs writing regarding the memory group MG0 and the word line WLek. A write operation performed in steps S26 to S36 is the same as that in steps S3 to S13 in the first embodiment.

In other words, the sequencer 17 stores the number of loops required to pass the first verify operation in the writing information register 15D, and performs a program operation until the second verify operation is passed. The write operation is finished, or data is written into the next cell unit CU on the basis of the order described in FIG. 12.

In step S22, when the sign j is not "e" (NO in step S22), subsequently, the sequencer 17 determines whether or not k is 0 (step S23).

In step S23, when k is 0 (YES in step S23), the sequencer 17 transitions to step S37, and performs a write operation regarding the memory group MG1 and the word line WLo0. An operation performed in steps S37 to S43 is the same as that in steps S26 to S32.

In other words, the sequencer 17 stores the number of loops required to pass the first verify operation in the writing information register 15D. Next, the sequencer 17 calculates a difference between the count value for WLe0 and the count value for WLo0, and stores the difference value in the writing information register 15D (step S44).

An operation performed in steps S45 to S48 is the same as that in steps S33 to S36. In other words, the sequencer 17 performs a program operation until the second verify operation is passed. The write operation is finished, or data is written into the next cell unit CU on the basis of the order described in FIG. 12.

When k is not 0 in step S23 (NO in step S23), the sequencer 17 performs a write operation regarding the word line WLok (here k is not 0). In other words, the sequencer 17 acquires the count value for WLek and the difference count value from the writing information register 15D (step S49), and calculates an estimated count value for WLok on the basis of the values (step S50).

The sequencer 17 sets the write voltage VPGMinit based on the count value (step S53), and performs a program operation until the second verify operation is passed (steps S54 to S57). The write operation is finished, or data is written into the next cell unit CU on the basis of the order described in FIG. 12.

When the variable i is not 0 or 1 in step S21 (NO in step S21), subsequently, the sequencer 17 determines whether or not the sign j is "e" (step S24).

When j is e in step S24 (YES in step S24), the sequencer 17 performs an operation regarding WLek other than the memory group MG0. In other words, the sequencer 17 acquires a count value for WLek from the writing information register 15D (step S52). The sequencer 17 performs processes in steps S53 to S57 in the same manner as the processes in step S50 and the subsequent steps described above.

In step S24, when the sign j is not "e" (NO in step S24), subsequently, the sequencer 17 determines whether or not k is 0 (step S25).

In step S25, when k is 0 (YES in step S25), the sequencer 17 performs an operation regarding WLo0 other than the memory group MG1. In other words, the sequencer 17 acquires a count value for WLo0 from the writing information register 15D (step S51). The sequencer 17 performs processes in steps S53 to S57 in the same manner as the processes in step S50 and the subsequent steps described above.

When k is not 0 in step S25 (NO in step S25), the sequencer 17 continuously performs the processes in steps S49 and S50. The sequencer 17 performs processes in steps S53 to S57 in the same manner as the processes in step S50 and the subsequent steps described above.

2.2 Effect Related to Second Embodiment

According to the present embodiment, it is possible to improve an operation speed of the semiconductor storage device. This effect will be described below.

In the configuration according to the present embodiment, a variation in characteristics of the memory cell transistor MT may have a correlation with a position of a layer. For example, a diameter of the memory pillar MP is gradually reduced from the upper layer side toward the lower layer side. In other words, there may be a correlation between a position of a layer and a diameter of the memory pillar.

As described above, in the same block BLK, it can be expected that a shape of the memory pillar MP is substantially uniform. In other words, in the same block BLK, it can be expected that a relationship between a layer position and a diameter measured in a certain memory pillar MP is the same for other memory pillars MP.

As described above, in the same block BLK, it can be expected that a difference in the memory pillar MP in the XY plane is substantially uniform, and a shape thereof is also substantially uniform. In other words, it can be expected that a shape of the even memory cell transistor MTe is substantially similar to another even memory cell transistor MTe in the same block BLK. This is also the same for the odd memory cell transistor MTo.

Therefore, the semiconductor storage device 10 according to the present embodiment calculates a difference between count values for the cell unit CU of the even memory group MG and the cell unit CU of the odd memory group MG, and estimates a count value. The semiconductor storage device 10 according to the present embodiment determines VPGMinit in a write operation in which the same block BLK is selected, on the basis of the estimated count value.

Specifically, as described in FIGS. 24 to 27, in a write operation in which a certain block BLK is selected, in a memory group MG (for example, the memory group MG0) on which first writing is performed, measurement is performed on all of the cell units CU through the first verify operation.

In a subsequent write operation, in a memory group MG (for example, the memory group MG1) which is different from the memory group MG on which first writing is performed in even number and odd number, measurement is performed on only the cell unit CU corresponding to the word line WLo0 on which first writing is performed, through the first verify operation.

The semiconductor storage device 10 calculates, for example, a difference between a count value for the word line WLe0 and a count value for the word line WLo0, and estimates a count value for each word line WLo on the basis of the calculated difference and a count value for each word line WLe.

In other words, in the second embodiment, in the same block BLK, a difference calculated on the basis of the first verify operation on the word lines WLe0 and WLo0 is used as a difference between count values for the word lines WLe and WLo provided in other layers.

Consequently, the semiconductor storage device 10 according to the second embodiment can estimate a count value corresponding to each of the word lines WLo1 to WLo7 without performing the first verify operation on the word lines WLo1 to WLo7 other than the word line WLo0.

As a result, the semiconductor storage device 10 according to the second embodiment can reduce time for a write operation in which the same block BLK is selected, by the omission of the first verify operation, and can thus improve an operation speed of the semiconductor storage device.

In the embodiment, as an example, in the word line WL0, a difference between a count value for the cell unit CU of the even memory group MG and a count value for the cell unit CU of the odd memory group MG is acquired. In a layer in which a count value for the cell unit CU of the even memory group MG is known, a count value for the cell unit CU of the odd memory group MG is estimated on the basis of the count value for the cell unit CU of the even memory group MG and the difference regarding the word line WL0. An estimation method in the present embodiment is not limited thereto.

For example, when a count value for the cell unit CU of the odd memory group MG in a certain layer is estimated, count values for the cell units CU of the even memory groups MG in a plurality of layers may be acquired without being limited to a count value for the cell unit CU of the even memory group MG located in the same layer as the cell unit CU of the odd memory group MG. A relationship between a layer position and a count value may be estimated on the basis of the acquired count values regarding the plurality of layers, and a difference between a count value for the cell unit CU of the even memory group MG and a count value for the cell unit CU of the odd memory group MG located in a different layer may be estimated. A count value for the cell unit CU of the odd memory group MG may be estimated by using the estimated difference.

Measurement of a count value using the first verify operation may be performed on a plurality of layers for the cell unit CU of the odd memory group MG. A difference between a count value for the cell unit CU of the even memory group MG and a count value for the cell unit CU of the odd memory group MG may be calculated in a plurality of layers. A count value for the cell unit CU of the odd memory group MG may be estimated by using a difference which differs due to a layer position.

In the embodiment, as an example, with respect to the word line WL on which measurement of a count value using the first verify operation is not performed, an estimated count value is calculated and acquired whenever writing is performed instead of writing and storing a count value in the writing information register 15D. The estimated count value may be calculated every time as mentioned above, and the calculated and estimated count value may be held in the register, and may be read from the register so as to be acquired afterward.

3. Third Embodiment

Next, a description will be made of a semiconductor storage device 10 according to a third embodiment. A semiconductor storage device 10 according to the third embodiment has the same configuration as that of the semiconductor storage device 10 of the first embodiment, and is different from that in terms of a method of measuring writing characteristics. Hereinafter, only differences from the first embodiment will be described.

3.1 Write Operation

Figure 28:
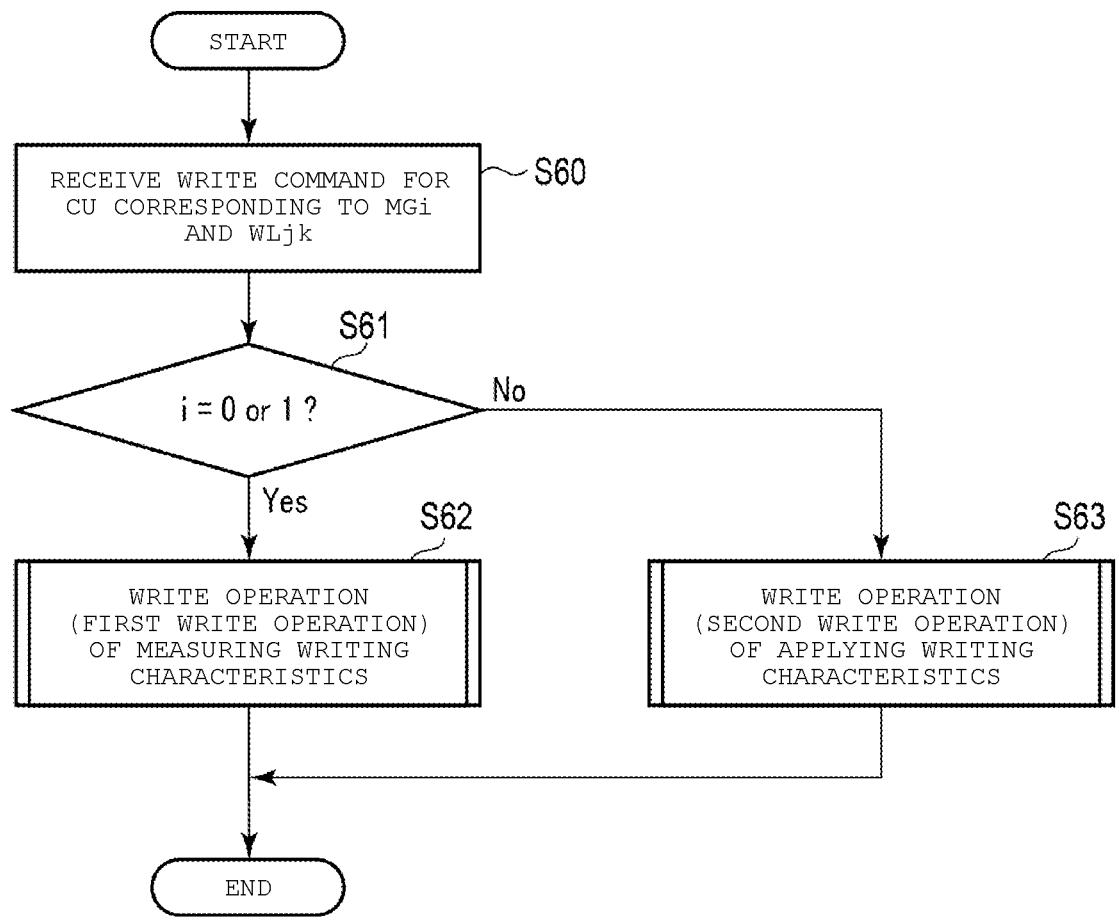
FIGS. 28-30 depict flowcharts illustrating a write operation according to a third embodiment.
Figure 29:
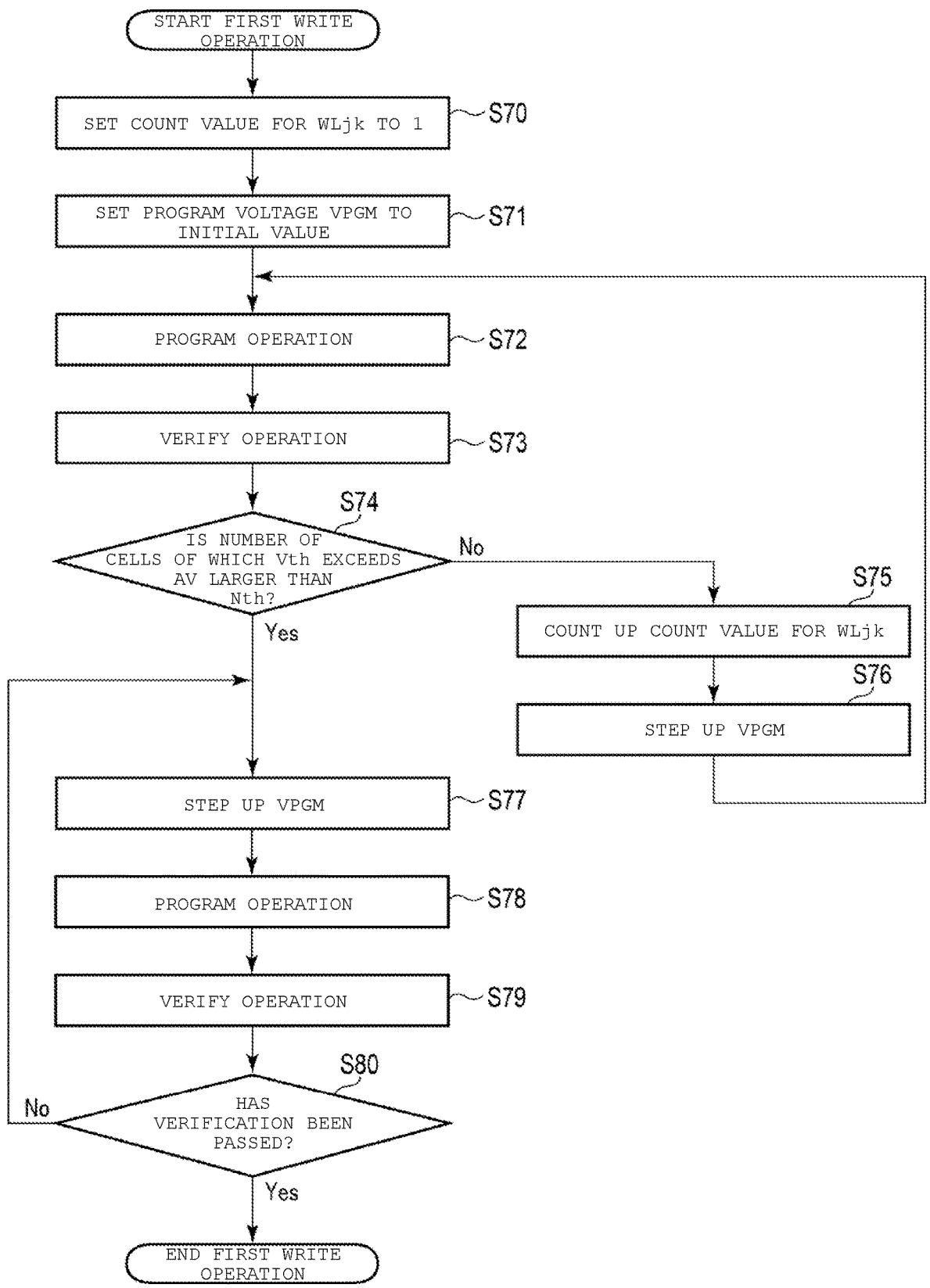
Figure 30:
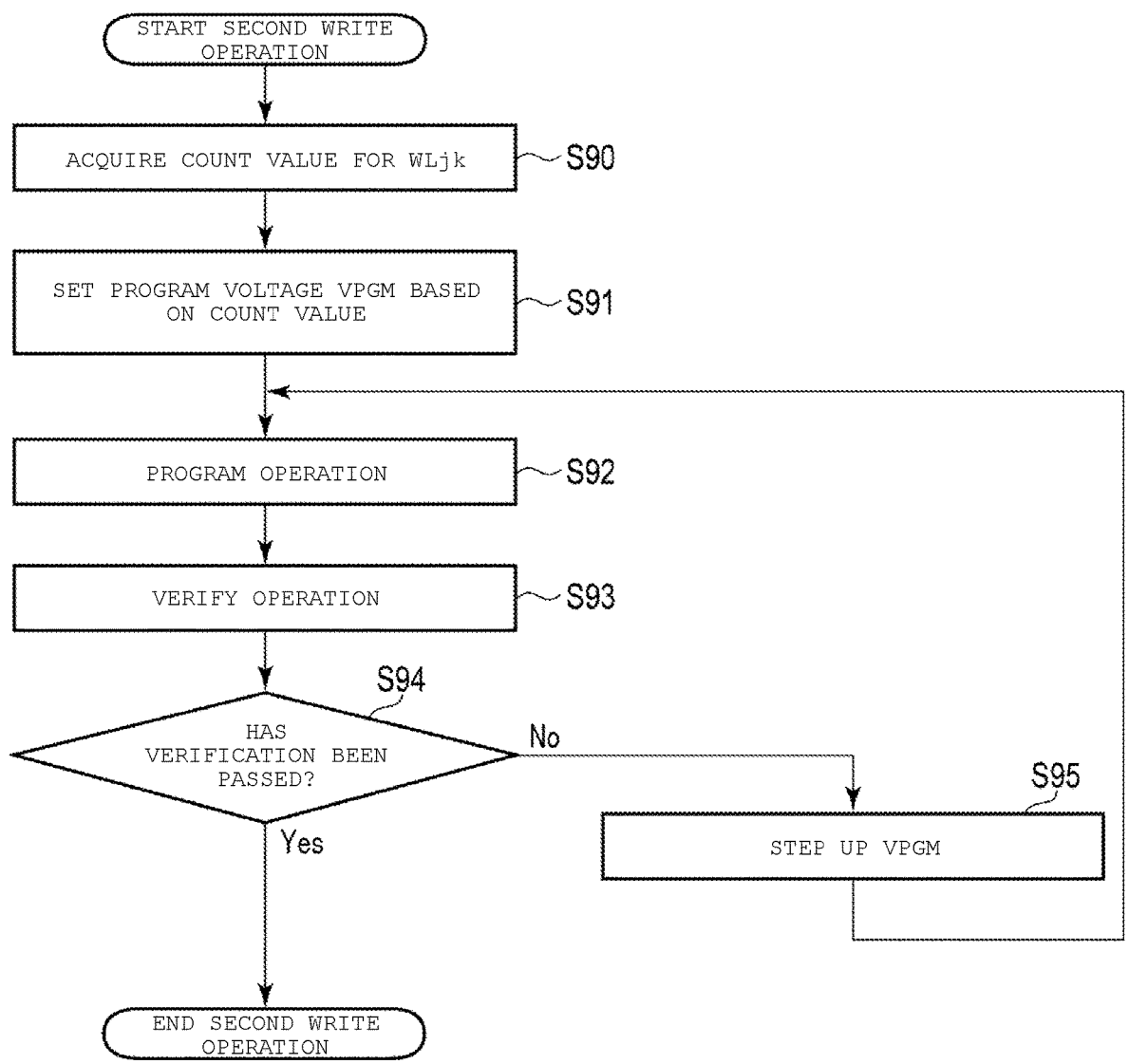

A write operation in the third embodiment uses the verification voltage AV in the "A" state for measuring writing characteristics. A write operation in the third embodiment will be described with reference to FIGS. 28 to 30. FIGS. 28 to 30 are flowcharts illustrating an example of a data writing method in the third embodiment.

As illustrated in FIG. 28, first, the semiconductor storage device 10 receives a write command (step S60). Specifically, in step S60, the semiconductor storage device 10 receives address information corresponding to the memory group MGi and the word line WLjk and a command for instructing a write operation to be performed. Then, the sequencer 17 performs a write operation on the cell unit CU corresponding to memory group MGi and the word line WLjk.

In the write operation, first, the sequencer 17 refers to the received address information, and checks whether or not the variable i is 0 or 1 (step S61). In other words, the sequencer 17 checks whether the memory group MG on which the write operation is performed is the memory group MG0 or the memory group MGi.

When the variable i is 0 or 1 in step S61 (YES in step S61), the sequencer 17 performs a write operation (hereinafter referred to as the first write operation) of measuring writing characteristics (step S62).

On the other hand, when the variable i is not 0 or 1 in step S61 (NO in step S61), the sequencer 17 performs a write operation (hereinafter referred to as the second write operation) of applying writing characteristics which have been previously measured (step S63).

When the first write operation in step S62 or the second write operation in step S63 is completed, the sequencer 17 finishes the write operation on the selected cell unit CU.

Hereinafter, the first write operation will be described with reference to FIG. 29. As illustrated in FIG. 29, when the first write operation is started, the sequencer 17 sets a count value for WLjk in the writing information register 15D to 1 (step S70), and sets the program voltage VPGM to the initial value VPGMinit (step S71).

Next, the sequencer 17 performs a program operation on the selected cell unit CU (step S72), and subsequently performs a verify operation on the cell unit CU (step S73).

The voltage Vdet used in the first and second embodiments is not used for the verify operation in the third embodiment. In other words, the same operation as the second verify operation described in the first embodiment is performed in the verify operation in the third embodiment, and thus only a verification voltage corresponding to the progress of a write operation is applied.

When the verify operation in step S73 is finished, the sequencer 17 determines whether or not the number of cells of the memory cell transistors MT of which the threshold voltage Vth exceeds the verification voltage AV is larger than a predetermined threshold number Nth (step S74). The threshold number Nth is set to, for example, a value which is equal to or greater than 1, and is smaller than the number of cells for determining whether or not verification of the "A" state is passed.

When the number of cells of the memory cell transistors MT of which the threshold voltage Vth exceeds the verification voltage AV is smaller than the threshold number Nth (NO in step S74), the sequencer 17 counts up the count value for WLjk in the writing information register 15D (step S75). The sequencer 17 steps up VPGM (step S76), and returns to the process in step S72. In other words, the sequencer 17 counts up the count value, and steps up VPGM, so as to perform a program operation and a verify operation again.

On the other hand, when the number of cells of the memory cell transistors MT of which the threshold voltage Vth exceeds the verification voltage AV is larger than the threshold number Nth (YES in step S74), the sequencer 17 fixes a count value for the word line WL on which the write operation is being performed, and executes a subsequent software program loop.

Specifically, the sequencer 17 steps up VPGM (step S77), performs a program operation (step S78), and performs a verify operation (step S79).

As a result of the verify operation in step S79, when verification has failed (NO in step S80), the sequencer 17 returns to step S77, and performs a program operation and a verify operation in which VPGM is stepped up again.

On the other hand, as a result of the verify operation in step S79, when verification has passed (YES in step S80), the sequencer 17 finishes the first write operation.

Next, the second write operation will be described with reference to FIG. 30. As illustrated in FIG. 30, when the second write operation is started, the sequencer 17 acquires a count value for WLjk from the writing information register 15D (step S90), and sets VPGM based on the count value (step S91).

The sequencer 17 performs a program operation using VPGM based on the count value on the selected cell unit CU in the same manner as in the first embodiment (step S92), and subsequently performs a verify operation on the cell unit CU (step S93).

As a result of the verify operation in step S93, when verification has failed (NO in step S94), the sequencer 17 steps up VPGM (step S95), returns to step S92, and performs a program operation and a verify operation again.

On the other hand, as a result of the verify operation in step S93, when verification has passed (YES in step S94), the sequencer 17 finishes the second write operation.

3.2 Effect Related to Third Embodiment

It may be estimated that a threshold voltage distribution (a threshold voltage distribution of the "ER" state) in an erase state of each cell unit CU is generally a normalized distribution. Therefore, the semiconductor storage device 10 according to the third embodiment estimates a count value of software program loops required for an increase to a predetermined threshold voltage by using the verification voltage AV in a typical verify operation.

Specifically, for example, in a verify operation using the verification voltage AV, the sequencer 17 sets threshold number Nth which is different from the number of cells used to determine whether or not verification is passed, to an appropriate numerical value, and thus estimates a timing at which the memory cell transistor MT of the cell unit CU increases to a predetermined threshold voltage in the same manner as in the first embodiment.

In other words, in a write operation of the semiconductor storage device 10 according to the third embodiment, the role of the first verify operation in the first embodiment is allocation of a typical verification voltage corresponding to the second verify operation in the first embodiment.

Consequently, in the semiconductor storage device 10 according to the third embodiment, in the same manner as in the first embodiment, the write voltage VPGMinit appropriate for characteristics of each cell unit CU can be used, and thus the first verify operation in the first embodiment can be omitted. As a result, the semiconductor storage device 10 according to the third embodiment can achieve the same effect as that in the first embodiment, and can also reduce a write operation time more than in the first embodiment.

In the third embodiment, a case of setting of the threshold number Nth corresponding to the role of the first verify operation has been illustrated, but this is only an example. For example, the semiconductor storage device 10 may determine a value of VPGMinit in a write operation in which the subsequent memory group MG is selected, on the basis of the number of software program loops at the time at which verification of the "A" state is passed.

Figure 31:
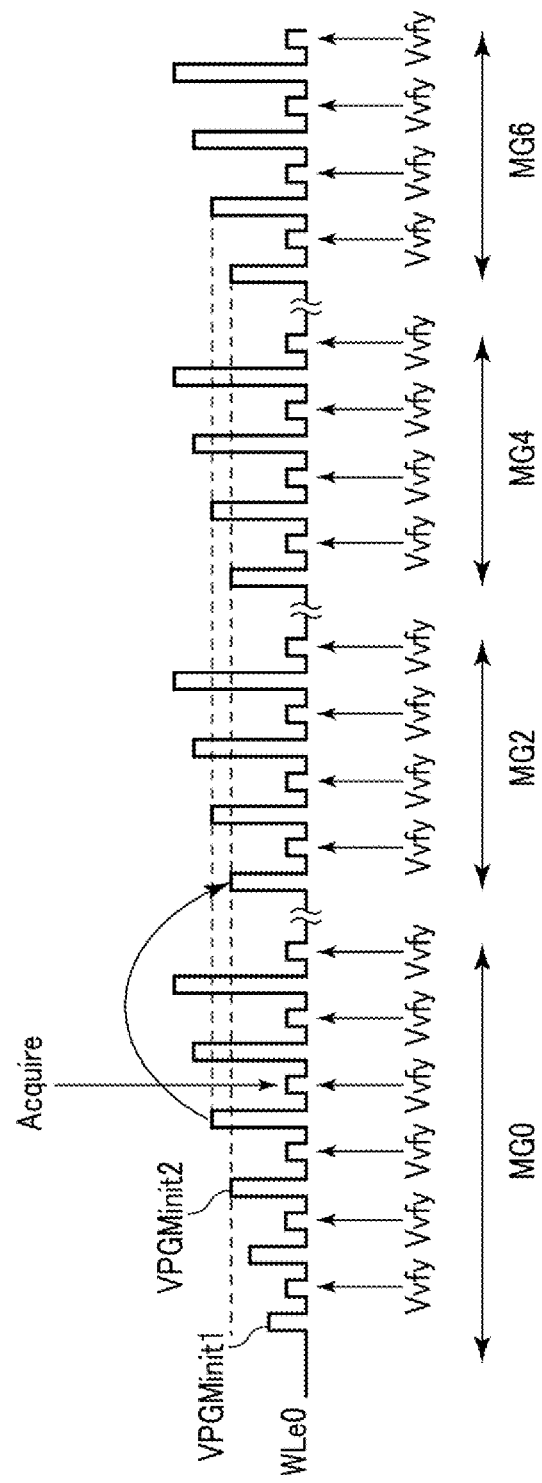
FIG. 31 is a diagram illustrating an example of a waveform of voltages applied to a word line during a write operation according to a modification example of the third embodiment.

FIG. 31 is a schematic diagram illustrating an example of a voltage change of the word line WLe0 during data writing in a modification example of the third embodiment. FIG. 31 illustrates a voltage change of a selected word line in programming and verification when the same data is written into the even memory groups MG from the memory group MG0 to the memory group MG6 in the order illustrated in FIG. 12. For simplification of description, FIG. 31 illustrates one voltage value for the verification, but, actually, verification for each level may be performed with different voltage values as appropriate.

As illustrated in FIG. 31, in a write operation in which the memory group MG0 is selected, VPGMinit1 is used in a first program operation. In this example, verification of the "A" state is passed in a fourth program operation, and a count value is determined ("Acquire" in FIG. 31).

On the other hand, in each of write operations in which the memory groups MG2, MG4, and MG6 are selected, VPGMinit2 higher than VPGMinit1 is used in a first program operation. For example, VPGMinit2 is lower than a fourth program voltage applied when the count value for the memory group MG0 is determined, and is the same as a program voltage applied at the third time in the memory group MG0.

In the modification example of the third embodiment, as a method of determining the write voltage VPGMinit based on a count value, a description has been made of an example of a method in which a program voltage applied at the (N−1)-th time is used when a count value is not used when the count value is N time. However, a method of determining the write voltage VPGMinit based on a count value is not limited thereto, and various other methods may be used.

4. Modification Examples

Examples in which the embodiments are based on the structures in FIGS. 3 to 8 have been described hitherto. However, the embodiments may be applied to other structures. FIGS. 32 to 35 illustrate examples of structures to which the embodiments are applicable.

Figure 32:
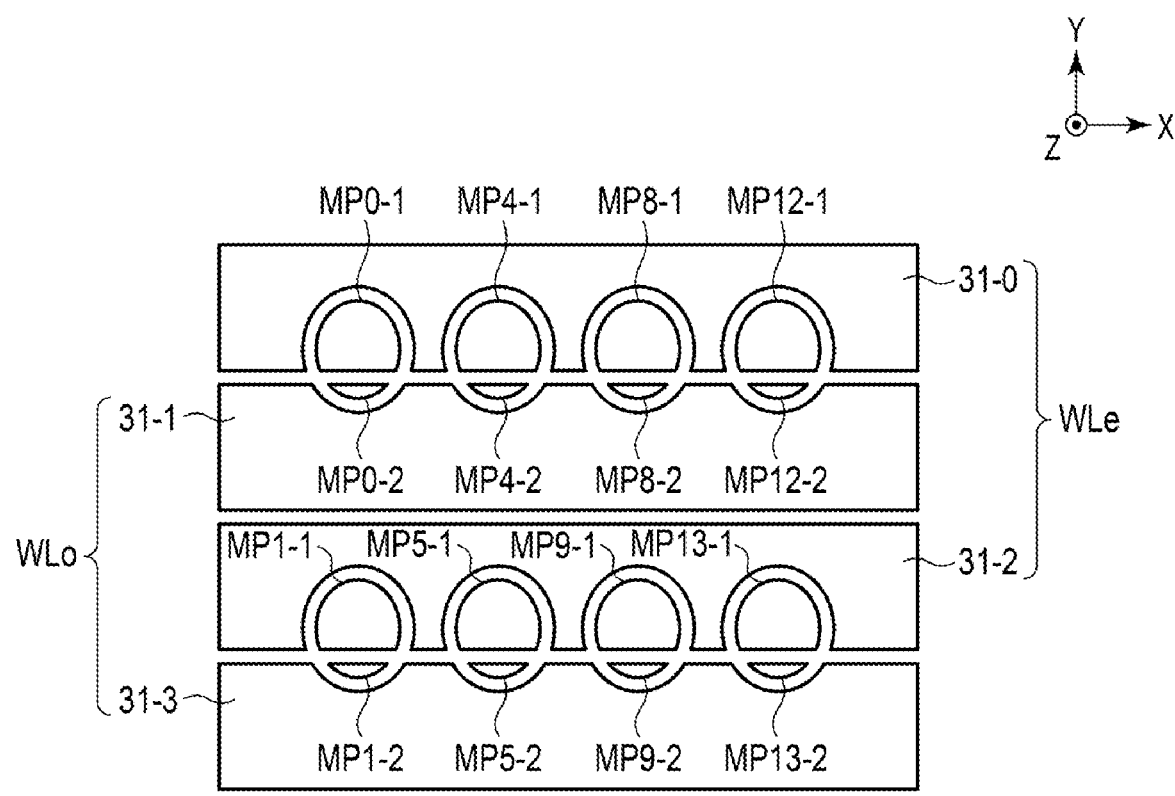
FIG. 32 is a planar layout illustrating a word line according to a modification example of the first to third embodiments.

FIG. 32 illustrates a planar structure of a part of a second structure of the semiconductor storage device 10 of an embodiment in the same manner as the first structure illustrated in FIG. 4, and illustrates a layer of a certain wiring layer 30. Layers of other wiring layers 30 have the same structure.

As illustrated in FIG. 32, each memory pillar MP is divided into two partial pillars MP-1 and MP-2. A boundary between the partial pillars MP-1 and MP-2 matches, for example, a boundary and a part of the wiring layer 31-0 and a part of the wiring layer 31-1 aligned with the part of the wiring layer 31-0.

Figure 33:
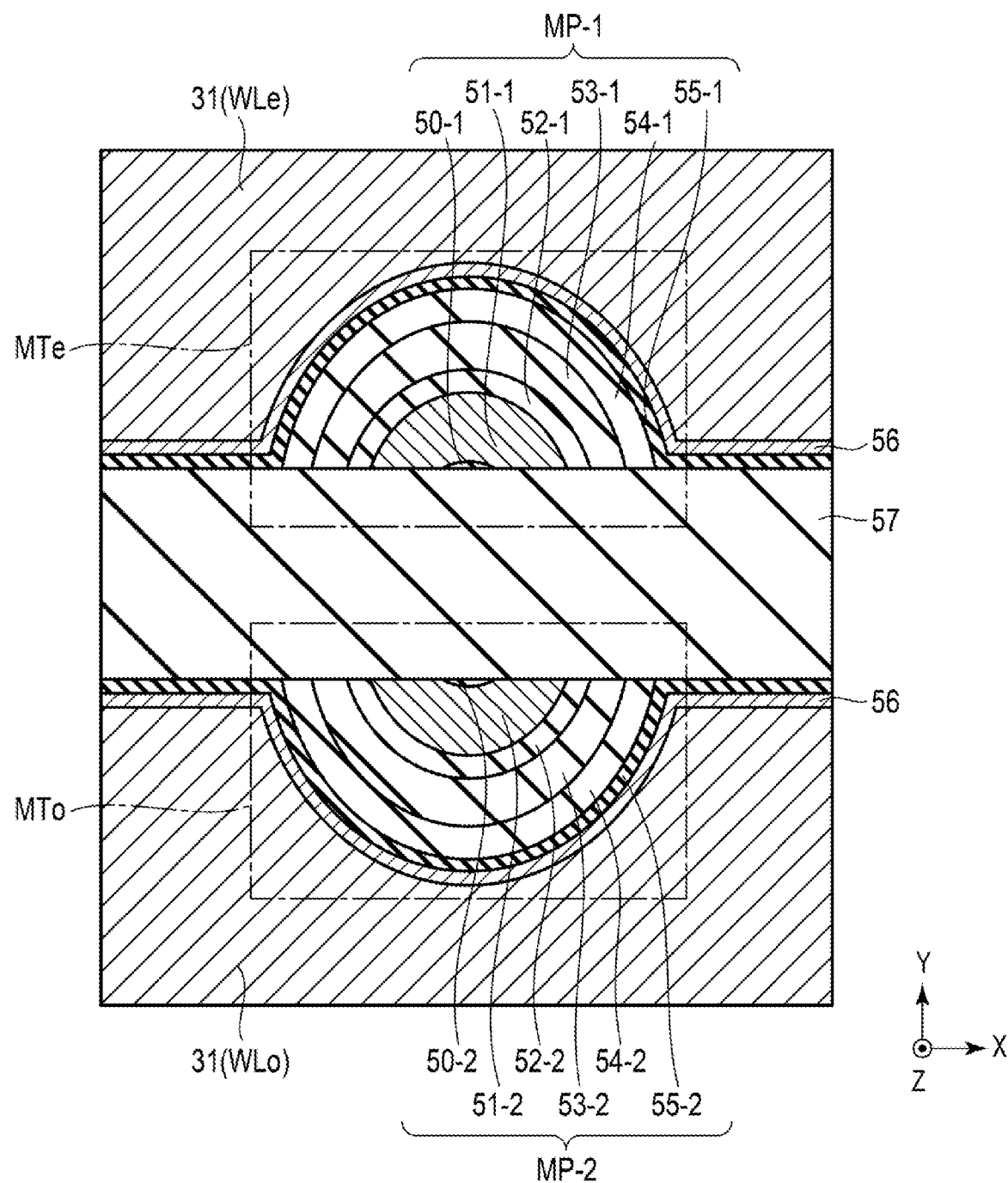
FIG. 33 is a sectional view illustrating a memory cell transistor according to a modification example of the first to third embodiments.

FIG. 33 illustrates a part of the second structure of the semiconductor storage device 10 of the embodiment, and illustrates a structure of a section of each memory pillar MP along the XY plane. As illustrated in FIG. 33, as described above, the single memory pillar MP in the first structure illustrated in FIG. 7 is divided into the two partial pillars MP-1 and MP-2. On the basis thereof, each of the insulating layer 50, the semiconductor layer 51, the insulating layer 52, the insulating layer 53, and the insulating layer 54 is also divided into two parts as follows.

The insulating layer 50 in the first structure is divided into an insulating layer 50-1 and an insulating layer 50-2. The semiconductor layer 51 in the first structure is divided into a semiconductor layer 51-1 and a semiconductor layer 51-2. The insulating layer 52 in the first structure is divided into an insulating layer 52-1 and an insulating layer 52-2. The insulating layer 53 in the first structure is divided into an insulating layer 53-1 and an insulating layer 53-2. The insulating layer 54 in the first structure is divided into an insulating layer 54-1 and an insulating layer 54-2.

The insulating layer 50-1, the semiconductor layer 51-1, the insulating layer 52-1, the insulating layer 53-1, and the insulating layer 54-1 are provided in the partial pillar MP-1. The insulating layer 50-2, the semiconductor layer 51-2, the insulating layer 52-2, the insulating layer 53-2, and the insulating layer 54-2 are provided in the partial pillar MP-2.

Figure 34:
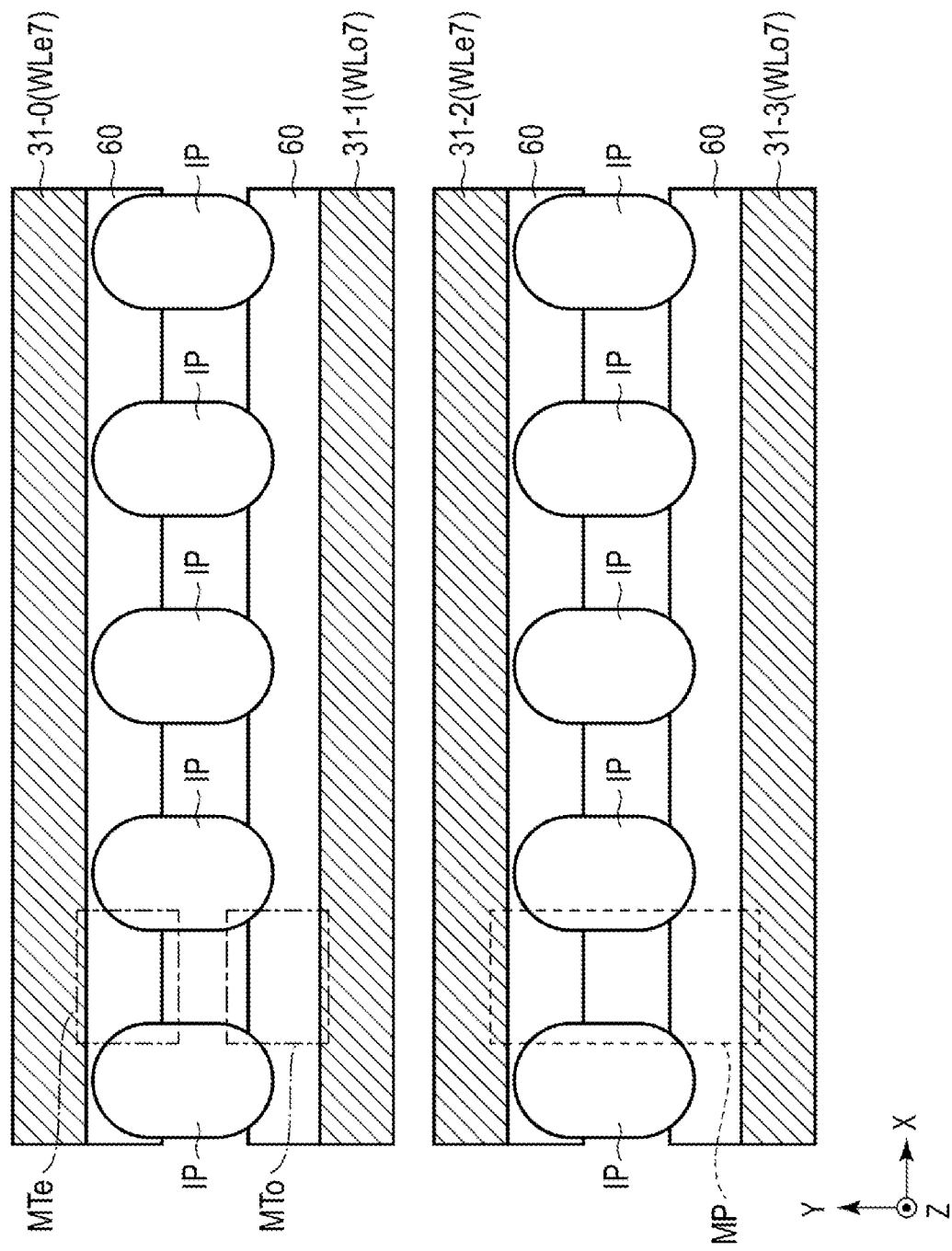
FIG. 34 is a planar layout illustrating a word line according to a modification example of the first to third embodiments.

FIG. 34 schematically illustrates a planar structure of a part of a third structure of the semiconductor storage device 10 of an embodiment in the same manner as the first structure illustrated in FIG. 4, and illustrates a layer of a certain wiring layer 31. Layers of other wiring layers 31 have the same structure.

As illustrated in FIG. 34, the wiring layer 31-0 (a part of the word line WLe7) and the wiring layer 31-1 (a part of the word line WLo7) extend along the X axis. The even wiring layer 31 and the odd wiring layer 31 are alternately arranged along the Y axis. Two odd wiring layers 31 with a single even wiring layer 31 interposed therebetween are connected to each other in a region not illustrated in FIG. 34 in the same manner as in the first embodiment. Two even wiring layers 31 with a single odd wiring layer 31 interposed therebetween are connected to each other in a region not illustrated in FIG. 34 in the same manner as in the first embodiment. Stacked bodies 60 are provided on two side surfaces of the even wiring layer 31 and the odd wiring layer 31 extending along the X axis. Each of the stacked bodies 60 includes conductors and insulators which are arranged along the Y axis.

A plurality of isolation pillars IP are provided between the two stacked bodies 60 arranged along the Y axis. The isolation pillars IP extend along the Z axis in the same manner as the memory pillars MP, but are formed of insulators unlike the memory pillars MP. Each of the isolation pillars IP partially overlaps each of the two stacked bodies 60 arranged along the Y axis, and isolates a part of the stacked body 60 into right and left sides of the isolation pillar IP. A portion between the two isolation pillars IP adjacent to each other in each stacked body 60 forms a single memory cell transistor MT. In other words, the portion which is located between the two isolation pillars IP adjacent to each other and is located between the even word line WLe and the odd word line WLo is a region corresponding to the memory pillar MP.

Figure 35:
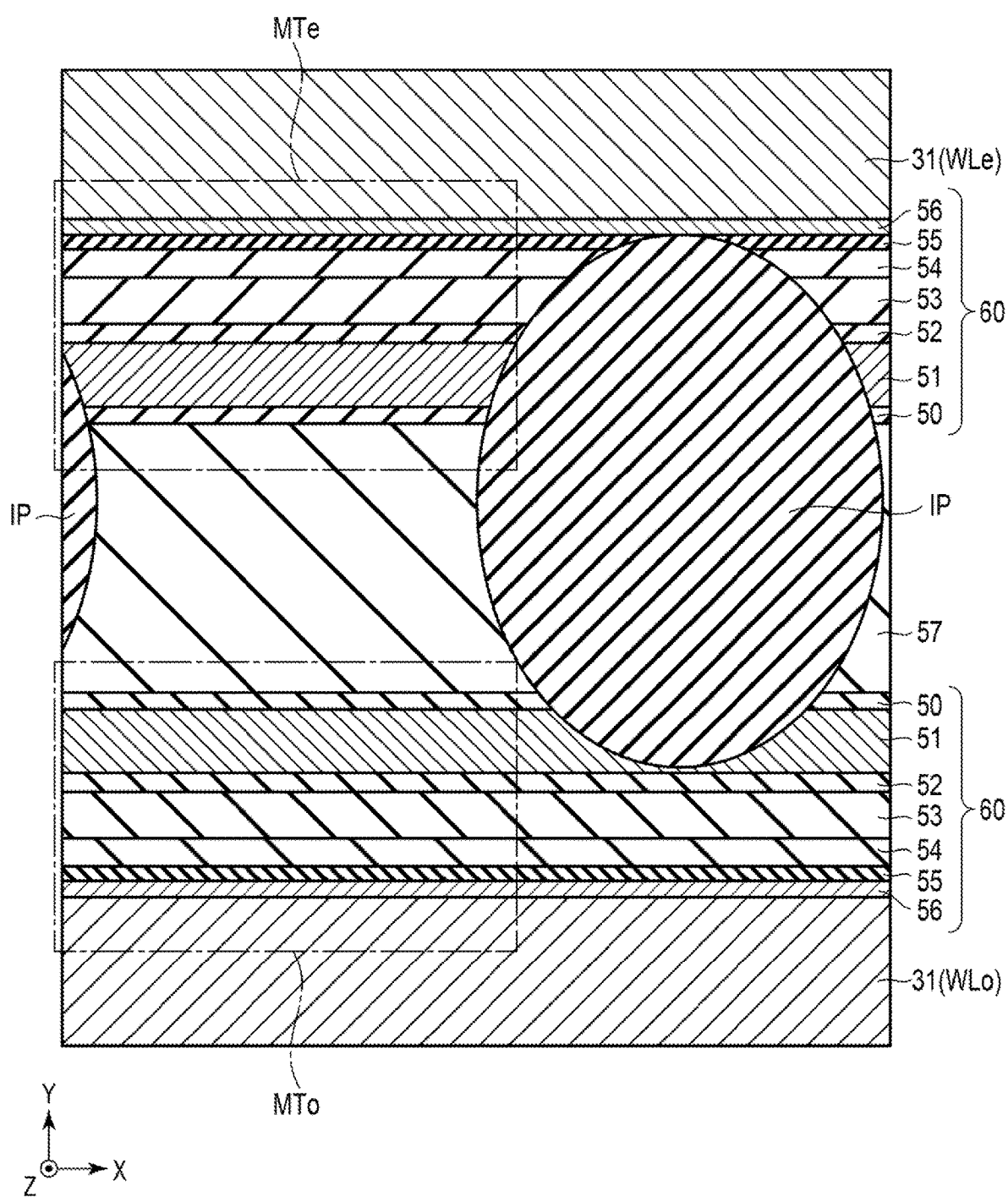
FIG. 35 is a sectional view illustrating a memory cell transistor according to the modification example of the first to third embodiments.

FIG. 35 illustrates a part of the third structure of the semiconductor storage device 10 of the embodiment, and illustrates a structure of a section of the isolation pillar IP along the XY plane. As illustrated in FIG. 35, the barrier metal layer 56 is provided on an XZ surface of each wiring layer 31. The insulating layer 55 is provided on an XZ surface of the barrier metal layer 56. The insulating layer 54 is provided on an XZ surface of the insulating layer 55. The insulating layer 53 is provided on an XZ surface of the insulating layer 54. The insulating layer 52 is provided on an XZ surface of the insulating layer 53. The semiconductor layer 51 is provided on an XZ surface of the insulating layer 52. The insulating layer 50 is provided on an XZ surface of the semiconductor layer 51. The insulating layer 57 is provided between the two insulating layers 50 arranged along the Y axis.

The embodiments may be variously modified in relation to an operation. For example, the memory group MG on which writing measurement of writing characteristics is performed may be the memory group MG which is initially accessed, may be the leading memory group MG of the block BLK, and may be the specific memory group MG.

A count value may be acquired whenever data is written into the memory group MG on which measurement of writing characteristics is performed, and a timing of acquisition thereof may be set.

The detection voltage Vdet in the first embodiment may be also used as, for example, the verification voltage AV in the "A" state or the read voltage AR in the "A" state. The detection voltage Vdet may be set in states other than the "ER" state and the "A" state. However, an operation is required to be changed as appropriate.

A verification voltage for determination using the predetermined threshold number Nth in the third embodiment is not limited to the verification voltage AV. As a verification voltage for determination using the predetermined threshold number Nth, any verification voltage may be used.

In the writing method according to the second embodiment, count values regarding layers other than a write target layer may be used to estimate a count value, and a count value may be estimated by referring to count values regarding a plurality of layers. In an example of the order illustrated in FIG. 12 or 14, information regarding a layer lower than a write target layer may be referred to in a case of layers other than the word line WL0. In this case, the number of layers to which reference is to be made may be restricted, and a count value which is not expected to be referred to may not be stored in the register. In an example of the order illustrated in FIG. 13, writing on all the even strings is completed, and then writing on the odd strings is performed. In other words, during the writing on the odd strings, count values regarding all layers may be used for estimation. Similarly, the number of layers to which reference is to be made may be restricted, and a count value which is not expected to be referred to may not be stored in the register. Consequently, the number of elements stored in the writing information register 15D can be reduced.

In the embodiments, the TLC method in which the memory cell transistor MT stores 3-bit data has been handled, but the memory cell transistor MT corresponding to the word line WL close to the uppermost layer or the lowermost layer may store 1-bit data by using a single-level cell (SLC) method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a plurality of memory cell transistors above a semiconductor substrate, including first, second, third, and fourth memory cell transistors, wherein the first and second memory cell transistors are at opposite sides of a first semiconductor body in which channel regions of the first and second memory cell transistors are located, and third and fourth memory cell transistors are at opposite sides of a second semiconductor body in which channel regions of the third and fourth memory cell transistors are located;
first, second, third, and fourth select transistors connected to the first, second, third, and fourth memory cell transistors, respectively;
a plurality of word lines including a first word line connected to gates of the first and third memory cell transistors, and a second word line connected to gates of the second and fourth memory cell transistors;
a first bit line connected to the first and second select transistors;
a second bit line connected to the third and fourth select transistors; and
a controller configured to perform a write operation on the first to fourth memory cell transistors in a plurality of loops, each loop including a program operation and a verify operation, wherein
during a program operation on the third memory cell transistor, the controller determines a program voltage to be applied to the first word line on the basis of a first number of loops, which is determined during the write operation performed on the first memory cell transistor, and
during a program operation on the fourth memory cell transistor, the controller determines a program voltage to be applied to the second word line on the basis of a second number of loops, which is determined during the write operation performed on the second memory cell transistor.

2. The semiconductor storage device according to claim 1, wherein
the program voltage that the controller determines during the program operation on the third memory cell transistor is an initial program voltage to be applied to the first word line during the write operation performed on the third memory cell transistor, and
the program voltage that the controller determines during the program operation on the fourth memory cell transistor is an initial program voltage to be applied to the second word line during the write operation performed on the fourth memory cell transistor.

3. The semiconductor storage device according to claim 2, wherein
the initial program voltage to be applied to the first word line during the write operation performed on the third memory cell transistor is greater than an initial program voltage applied to the first word line during the write operation performed on the first memory cell transistor, and
the initial program voltage to be applied to the second word line during the write operation performed on the fourth memory cell transistor is greater than an initial program voltage applied to the second word line during the write operation performed on the second memory cell transistor.

4. The semiconductor storage device according to claim 2, wherein
during the program operation on the third memory cell transistor, the controller determines the initial program voltage to be applied to the first word line on the basis of the first number of loops minus one, and
during the program operation on the fourth memory cell transistor, the controller determines the initial program voltage to be applied to the second word line on the basis of the second number of loops minus one.

5. The semiconductor storage device according to claim 1, wherein:
the plurality of memory cell transistors further includes a fifth memory cell transistor connected between the first memory cell transistor and the first select transistor, a sixth memory cell transistor connected between the second memory cell transistor and the second select transistor, a seventh memory cell transistor connected between the third memory cell transistor and the third select transistor, and an eighth memory cell transistor connected between the fourth memory cell transistor and the fourth select transistor;
the plurality of word lines further includes a third word line connected to gates of the fifth and seventh memory cell transistors, and a fourth word line connected to gates of the sixth and eighth memory cell transistors; and
the controller stores a difference between the first and second number of loops, and during a program operation on the sixth and eighth memory cell transistors, the controller determines a program voltage to be applied to the fourth word line on the basis of the stored difference.

6. The semiconductor storage device according to claim 1, wherein
the first number of loops is determined on the basis of a minimum number of loops that were executed during the write operation performed on the first memory cell transistor for a threshold voltage of the first memory cell transistor to be raised to at least a first voltage, and
the second number of loops is determined on the basis of a minimum number of loops that were executed during the write operation performed on the second memory cell transistor for a threshold voltage of the second memory cell transistor to be raised to at least a second voltage.

7. The semiconductor storage device according to claim 1, wherein
during the verify operations, a number of verification voltages are applied, and
the first and second voltages are less than a lowest one of the verification voltages.

8. The semiconductor storage device according to claim 1, wherein
during the verify operations, a number of verification voltages are applied, and
the first and second voltages are equal to a lowest one of the verification voltages.

9. The semiconductor storage device according to claim 1, wherein the write operations on the first and third memory cell transistors are performed sequentially, and the write operations on the second and fourth memory cell transistors are performed sequentially.

10. The semiconductor storage device according to claim 1, wherein the write operations on the first, second, third, and fourth memory cell transistors are performed sequentially.

11. The semiconductor storage device according to claim 1, wherein first and second semiconductor bodies are each a semiconductor pillar that extends above the semiconductor substrate.

12. The semiconductor storage device according to claim 11, wherein
the channel regions for the first and second memory cell transistors are located in the first semiconductor body and are electrically connected, and
the channel regions for the third and fourth memory cell transistors are located in the second semiconductor body and are electrically connected.

13. The semiconductor storage device according to claim 11, wherein
the channel regions for the first and second memory cell transistors are located in the first semiconductor body and are electrically isolated, and
the channel regions for the third and fourth memory cell transistors are located in the second semiconductor body and are electrically isolated.

14. The semiconductor storage device according to claim 1, further comprising:
first and second insulating pillars extending above the semiconductor substrate, wherein the first semiconductor body is between the first and second insulating pillars, and
third and fourth insulating pillars extending above the semiconductor substrate, wherein the second semiconductor body is between the first and second insulating pillars.

15. A semiconductor storage device comprising:
a plurality of memory cell transistors above a semiconductor substrate, including first, second, third, and fourth groups of memory cell transistors, wherein the first and second groups of memory cell transistors are respectively at opposite sides of a first group of semiconductor pillars spaced apart and aligned along a first direction, and the third and fourth groups of memory cell transistors are respectively at opposite sides of a second group of semiconductor pillars spaced apart and aligned along the first direction, and the first group of semiconductor pillars is spaced apart from the second group of semiconductor pillars in a second direction crossing the first direction;
a plurality of word lines stacked above the semiconductor substrate, including first and second word lines at a same level above the semiconductor substrate, wherein the first word line is connected to gates of the memory cell transistors in the first and third groups of memory cell transistors and the second word line is connected to gates of the memory cell transistors in the second and fourth groups of memory cell transistors; and
a controller configured to perform a write operation per group of memory cell transistors connected to one word line, wherein
during a write operation performed on the third group of memory cell transistors connected to the first word line, the controller determines an initial program voltage to be applied to the first word line on the basis of a first number of loops, which is determined during the write operation performed on the first group of memory cell transistors connected to the first word line, and
during a write operation performed on the fourth group of memory cell transistors connected to the second word line, the controller determines an initial program voltage to be applied to the second word line on the basis of a second number of loops, which is determined during the write operation performed on the second group of memory cell transistors connected to the second word line.

16. The semiconductor storage device according to claim 15, wherein the write operations on the first and third groups of memory cell transistors are performed sequentially, and the write operations on the second and fourth groups of memory cell transistors are performed sequentially.

17. The semiconductor storage device according to claim 15, wherein the write operations on the first, second, third, and fourth groups of memory cell transistors are performed sequentially.

18. A method of performing a write operation on a semiconductor storage device comprising a plurality of memory cell transistors above a semiconductor substrate, including first, second, third, and fourth memory cell transistors, wherein the first and second memory cell transistors are at opposite sides of a first semiconductor body in which channel regions of the first and second memory cell transistors are located, and third and fourth memory cell transistors are at opposite sides of a second semiconductor body in which channel regions of the third and fourth memory cell transistors are located, and a plurality of word lines including a first word line connected to gates of the first and third memory cell transistors, and a second word line connected to gates of the second and fourth memory cell transistors, said method comprising:
executing a write operation on the first memory cell transistor and then executing a write operation on the third memory cell transistor; and
executing a write operation on the second memory cell transistor and then executing a write operation on the fourth memory cell transistor, wherein
during the write operation performed on the third memory cell transistor, an initial program voltage applied to the first word line is set on the basis of a first number of loops, which is determined during the write operation performed on the first memory cell transistor, and
during the program operation performed on the fourth memory cell transistor, an initial program voltage applied to the second word line is set on the basis of a second number of loops, which is determined during the write operation performed on the second memory cell transistor.

19. The method of claim 18, further comprising:
during the write operation performed on the first memory cell transistor, counting a first minimum number of loops, which is the number of loops required for a threshold voltage of the first memory cell transistor to reach a first voltage, and storing the first minimum number of loops as the first number of loops, and during the write operation performed on the second memory cell transistor, counting a second minimum number of loops, which is the number of loops required for a threshold voltage of the second memory cell transistor to reach a second voltage, and storing the second minimum number of loops as the second number of loops.

20. The method of claim 19, wherein the initial program voltage applied to the first word line during the write operation performed on the third memory cell transistor is greater than an initial program voltage applied to the first word line during the write operation performed on the first memory cell transistor, and the initial program voltage applied to the second word line during the write operation performed on the fourth memory cell transistor is greater than an initial program voltage applied to the second word line during the write operation performed on the second memory cell transistor.

* * * * *